United States Patent
Stautner et al.

(10) Patent No.: US 10,578,251 B2
(45) Date of Patent: Mar. 3, 2020

(54) SYSTEMS AND METHOD FOR A DYNAMIC SEAL ASSEMBLY FOR A FLUID DELIVERY SYSTEM

(71) Applicant: General Electric Company, Schenectady, NY (US)

(72) Inventors: Ernst Wolfgang Stautner, Niskayuna, NY (US); Jonathan Alan Murray, Dousman, WI (US); Patrick Lively Padgett, Detroit, MI (US)

(73) Assignee: General Electric Healthcare, Schenectady, NY (US)

( * ) Notice: Subject to any disclaimer, the term of this patent is extended or adjusted under 35 U.S.C. 154(b) by 222 days.

(21) Appl. No.: 15/694,669

(22) Filed: Sep. 1, 2017

(65) Prior Publication Data
US 2019/0003653 A1  Jan. 3, 2019

Related U.S. Application Data

(63) Continuation-in-part of application No. 15/636,473, filed on Jun. 28, 2017.

(51) Int. Cl.
| | | |
|---|---|---|
| *F17C 13/06* | (2006.01) | |
| *F16J 15/06* | (2006.01) | |
| *A61J 1/16* | (2006.01) | |
| *F17C 3/08* | (2006.01) | |

(Continued)

(52) U.S. Cl.
CPC .............. *F17C 13/06* (2013.01); *A61J 1/165* (2013.01); *F16J 15/067* (2013.01); *F17C 3/085* (2013.01); *F16J 15/022* (2013.01); *G01R 33/31* (2013.01)

(58) Field of Classification Search
CPC ..... F17C 13/06; F17C 5/02; F17C 5/07; F17C 2221/017; A61J 1/165; A61J 1/1412
See application file for complete search history.

(56) References Cited

U.S. PATENT DOCUMENTS

| 8,731,640 B2 * | 5/2014 | Urbahn ................. G01N 13/00 424/9.3 |
| 2016/0084437 A1 * | 3/2016 | Spencer .................... F17C 1/06 220/582 |

OTHER PUBLICATIONS

"Sealing Rings for Dynamic Seals," Schunk Group Business Unit Tribology Brochure, Available Online at www.schunk-group.pl/sixcms/media.php/1696/tribo-brochures-en-30_38e_Sealing_Rings.pdf, Available as Early as Jan. 1, 2009, 20 pages.

(Continued)

*Primary Examiner* — Brian M King
(74) *Attorney, Agent, or Firm* — McCoy Russell LLP

(57) ABSTRACT

Methods and systems are provided for a sealing system for a dynamic nuclear polarization (DNP) system. In one embodiment, a system comprises: a reservoir including an inlet opening; an outer tube; and a tapered seal shaped to seal against the inlet opening and the outer tube, the tapered seal including: a first section removably coupleable to a second section; a through-hole formed by a first plurality of inner surfaces of both the first section and the second section, the through-hole shaped to encircle the outer tube; and a vacuum channel extending through, from an outer surface to an inner surface of the first plurality of inner surfaces, one of the first section and second section. In this way, the tapered seal may be coupled around the fluid passage without inserting a tip of the fluid passage through the through-hole of the tapered seal, thereby maintaining a sterility of the system.

20 Claims, 19 Drawing Sheets

(51) Int. Cl.
　　　*F16J 15/02*　　　　(2006.01)
　　　*G01R 33/31*　　　(2006.01)

(56) References Cited

OTHER PUBLICATIONS

"Mechanical packing design and theory of operation," Compressor Products International Booklet, Reprinted from 1968 original by Ed Cummings, Available Online at http://www.c-p-i.com/media/cms_page_media/11/cpi%20mech%20pck%20bklt%20US-updte6%2011-.pdf, Jun. 2011, 16 pages.

Ardenkjaer-Larsen, J. et al., "Dynamic Nuclear Polarization Polarizer for Sterile Use Intent," NMR in Biomedicine Special Issue: Polarized Carbon-13 Technology and Its Application in Biomedical Imaging, vol. 24, No. 8, Oct. 2011, Available Online Mar. 18, 2011, 6 pages.

"Advanced solutions for the Hydropower sector," Morgan Advanced Materials Seals and Bearings Brochure, Available Online at www.morgansealsandbearings.com/media/1104/advanced_solutions_for_the_hydropower_sector.pdf, Apr. 2015, 6 pages.

\* cited by examiner

SYSTEMS AND METHOD FOR A DYNAMIC SEAL ASSEMBLY FOR A FLUID DELIVERY SYSTEM

CROSS REFERENCE TO RELATED APPLICATIONS

The present application is a continuation-in-part of U.S. application Ser. No. 15/636,473, entitled "SYSTEMS AND METHOD FOR A DYNAMIC SEAL ASSEMBLY FOR A FLUID DELIVERY SYSTEM", filed on Jun. 28, 2017. The entire contents of the above application are hereby incorporated by reference in its entirety for all purposes.

FIELD

Embodiments of the subject matter disclosed herein relate to diagnostic medical imaging, and more particularly, to dynamic nuclear polarization systems.

BACKGROUND

A dynamic nuclear polarization (DNP) system may be utilized to prepare contrast agents (e.g., 13C1-Pyruvate) for imaging via imaging modalities such as magnetic resonance imaging (MM) and nuclear magnetic resonance (NMR) spectroscopy. Increasing a polarization of the nuclear spins of the contrast agents may increase a sensitivity of the imaging modalities. In order to provide conditions for increasing the polarization of the nuclear spins, a temperature of the contrast agents is decreased by positioning the contrast agents within a container (e.g., a vial) and submerging the container into a bath of liquid helium within a vacuum chamber of the DNP system. In order to retain the liquid helium within the vacuum chamber, an inlet opening of the vacuum chamber may be closed by a sterilized sealing system. A magnetic field is produced across the vacuum chamber by one or more magnets of the DNP system, and the contrast agents are hyperpolarized by microwave radiation at an appropriate frequency from a microwave radiation source of the DNP system. The hyperpolarized contrast agents may be mixed with a dissolution medium such as an aqueous solution of sodium hydroxide and tris(hydroxymethyl)aminomethane and may be transported to a location external to vacuum chamber for analysis via MRI, NMR, or other imaging modality.

BRIEF DESCRIPTION

In one embodiment, a system comprises: a reservoir including an inlet opening; an outer tube; and a tapered seal shaped to seal against the inlet opening and the outer tube, the tapered seal including: a first section removably coupleable to a second section; a through-hole formed by a first plurality of inner surfaces of both the first section and the second section, the through-hole shaped to encircle the outer tube; and a vacuum channel extending through, from an outer surface to an inner surface of the first plurality of inner surfaces, one of the first section and second section. In one example, the system may be for a dynamic nuclear polarization system.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

Figure 16B:
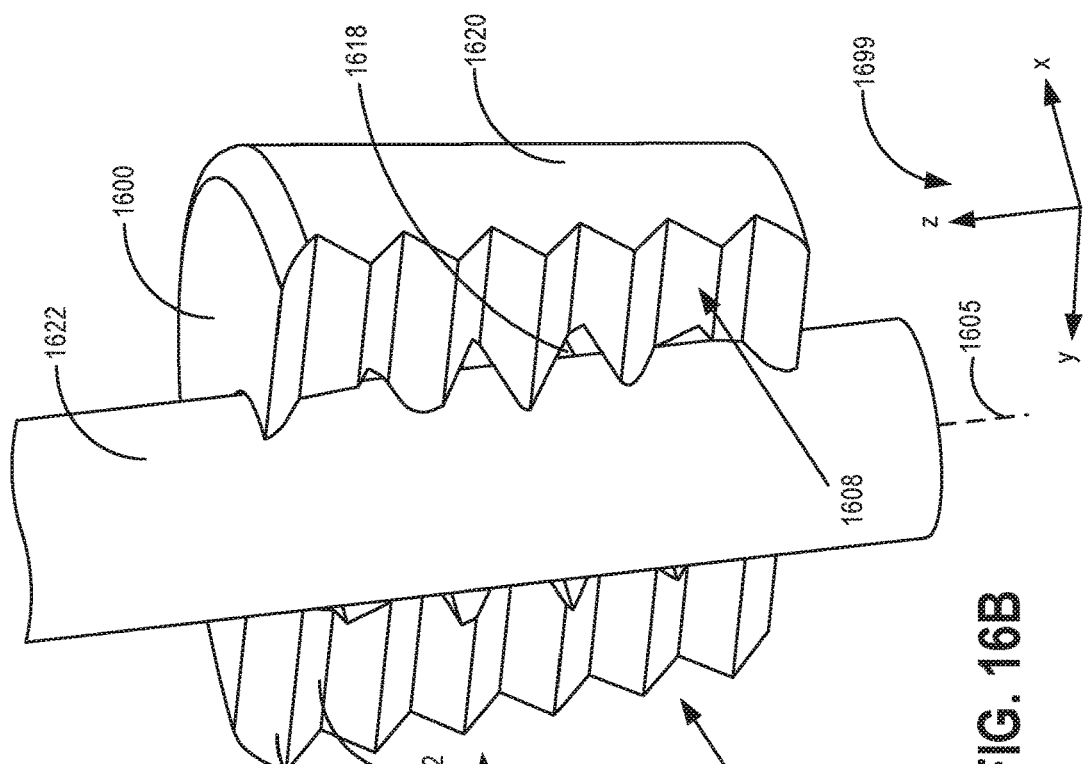
FIG. 16A shows a perspective view of a section of a tapered seal for a sealing system of a DNP system, and FIG.
Figure 16A:
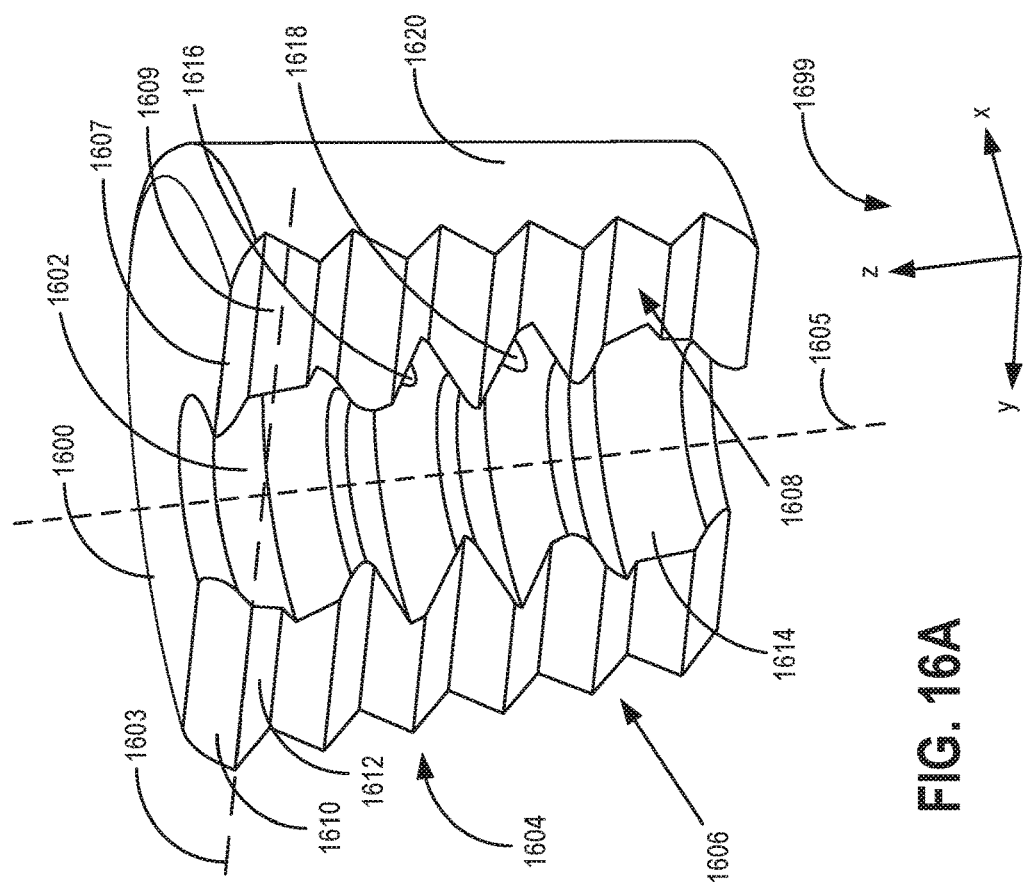

16B shows a perspective view of a fluid passage positioned within a central opening of the section of the tapered seal of FIG. 16A, according to an embodiment of the invention.

Figure 17:
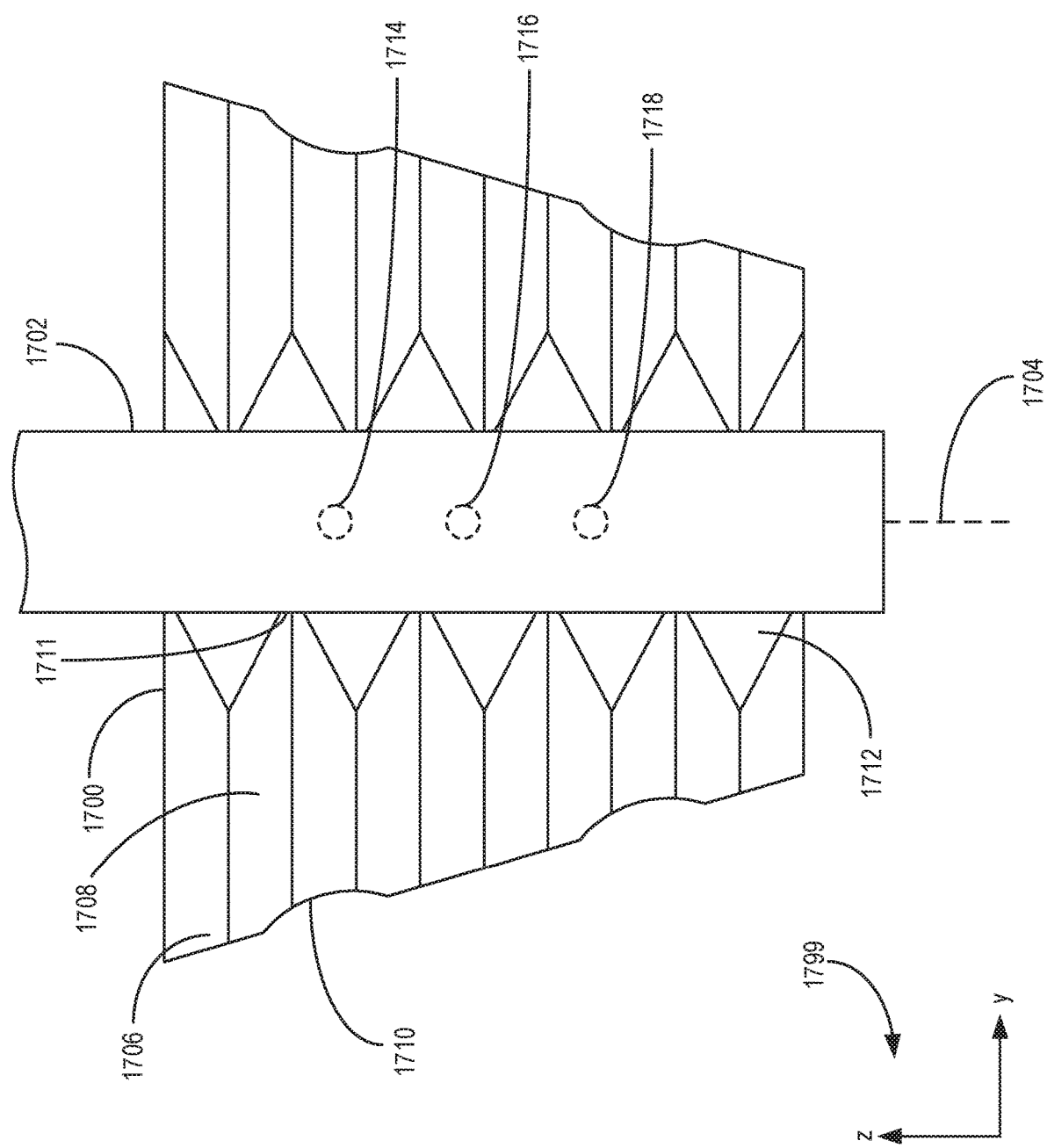

FIG. 17 shows a side view of a first section of a tapered seal for a sealing system of a DNP system and a fluid passage positioned therein, according to an embodiment of the invention.

Figures 18A, 18B, 18C:
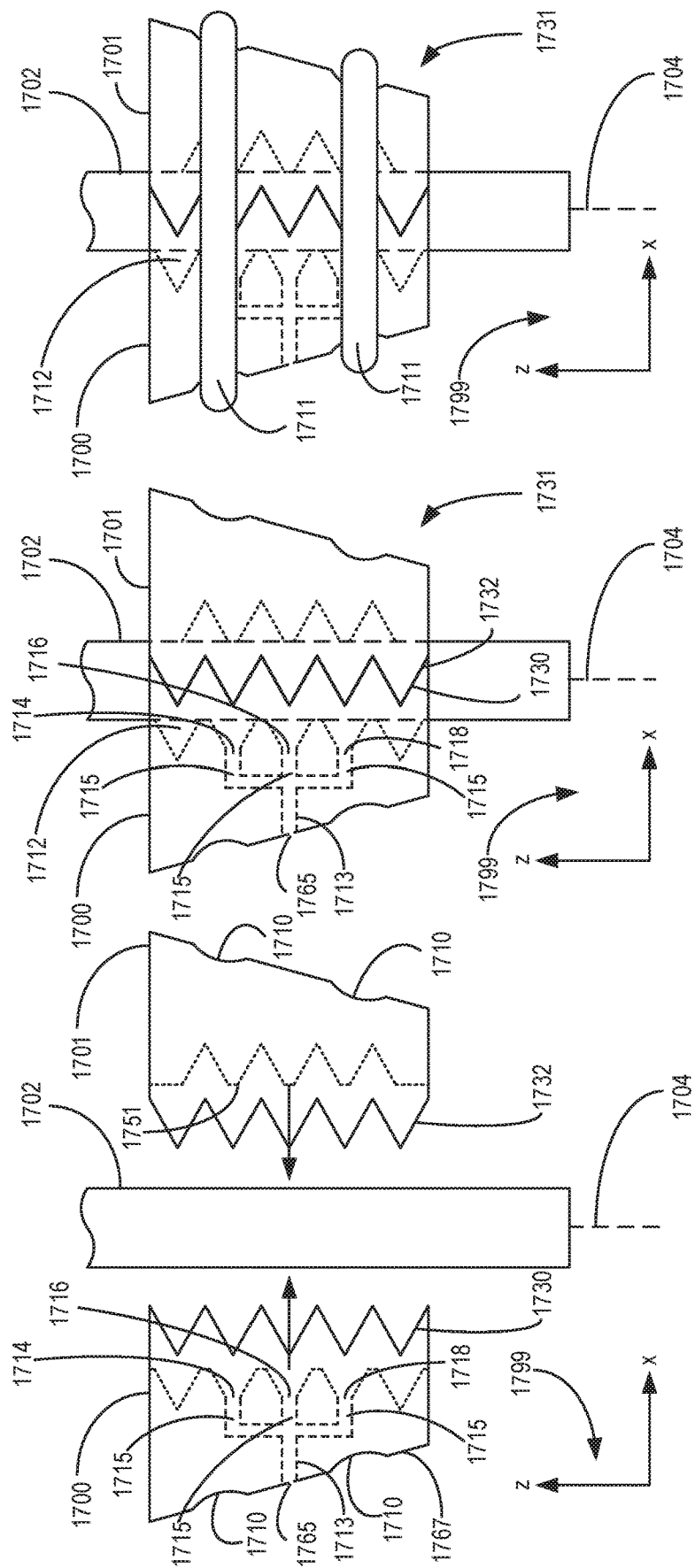

FIG. 18A shows a side view of the first section and a second section of the tapered seal of FIG. 17 with each section decoupled from the fluid passage, FIG. 18B shows the sections of the tapered seal positioned to surround an outer perimeter of the fluid passage, and FIG. 18C shows the sections of the tapered seal surrounding the fluid passage and coupled together by a plurality of rings, according to an embodiment of the invention.

Figure 19:
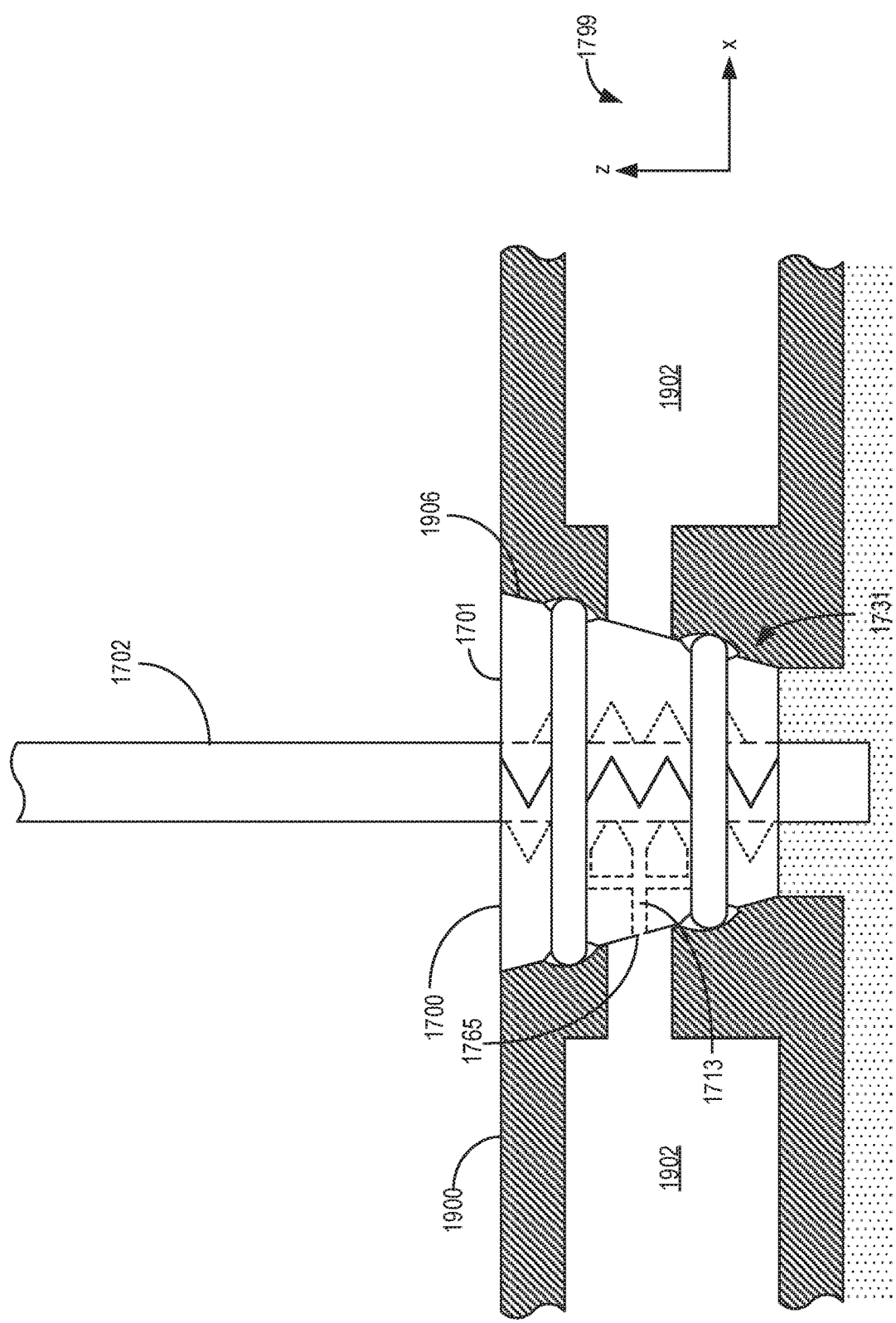

FIG. 19 shows the tapered seal of FIG. 17 coupled to an inlet opening of a vacuum chamber of the DNP system with the vacuum chamber shown in cross-section, according to an embodiment of the invention.

FIGS. 2-19 are shown to scale, though other relative dimensions may be used, if desired.

DETAILED DESCRIPTION

Figure 2:
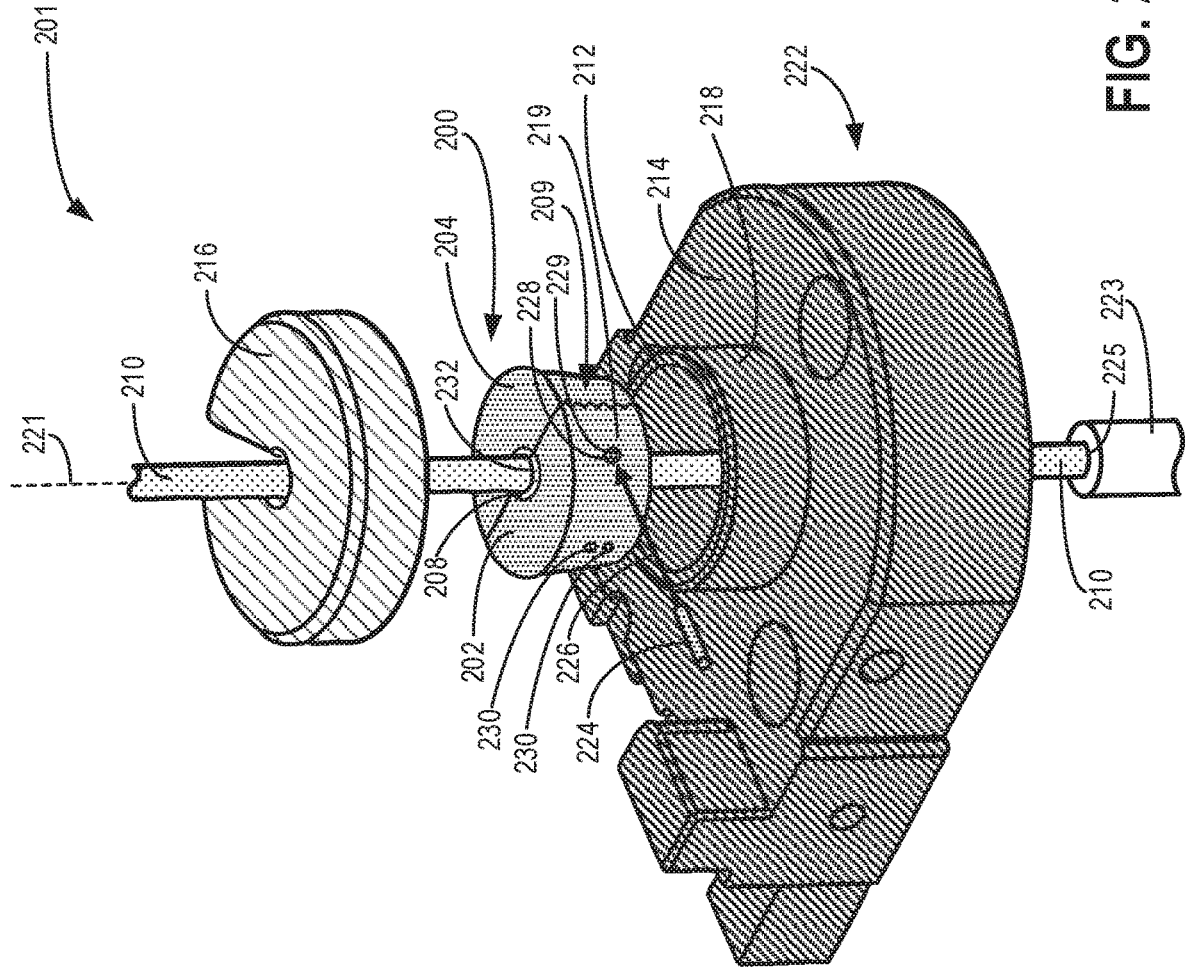
FIG. 2 shows a perspective view of a first embodiment of a sealing system for a DNP system, according to an embodiment of the invention.
Figure 2:
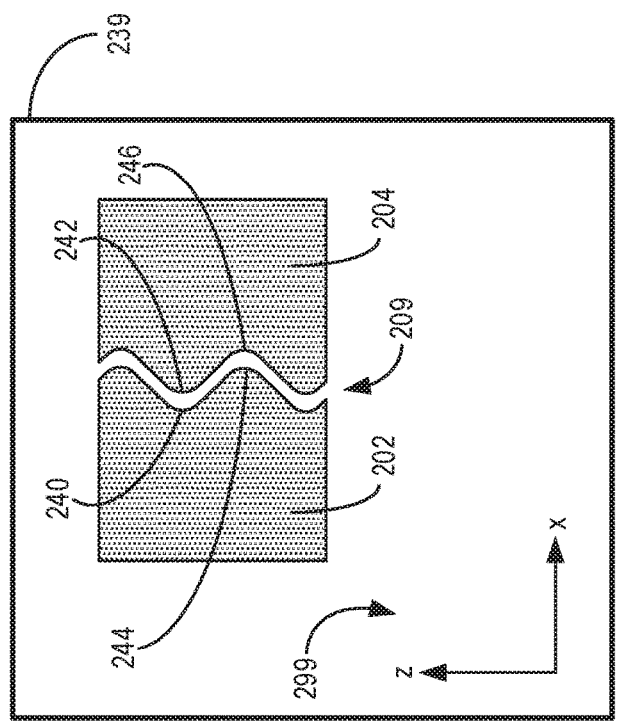
Figure 2:
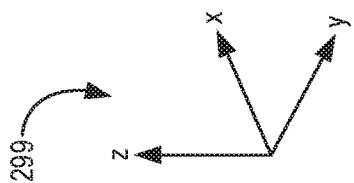
Figure 3:
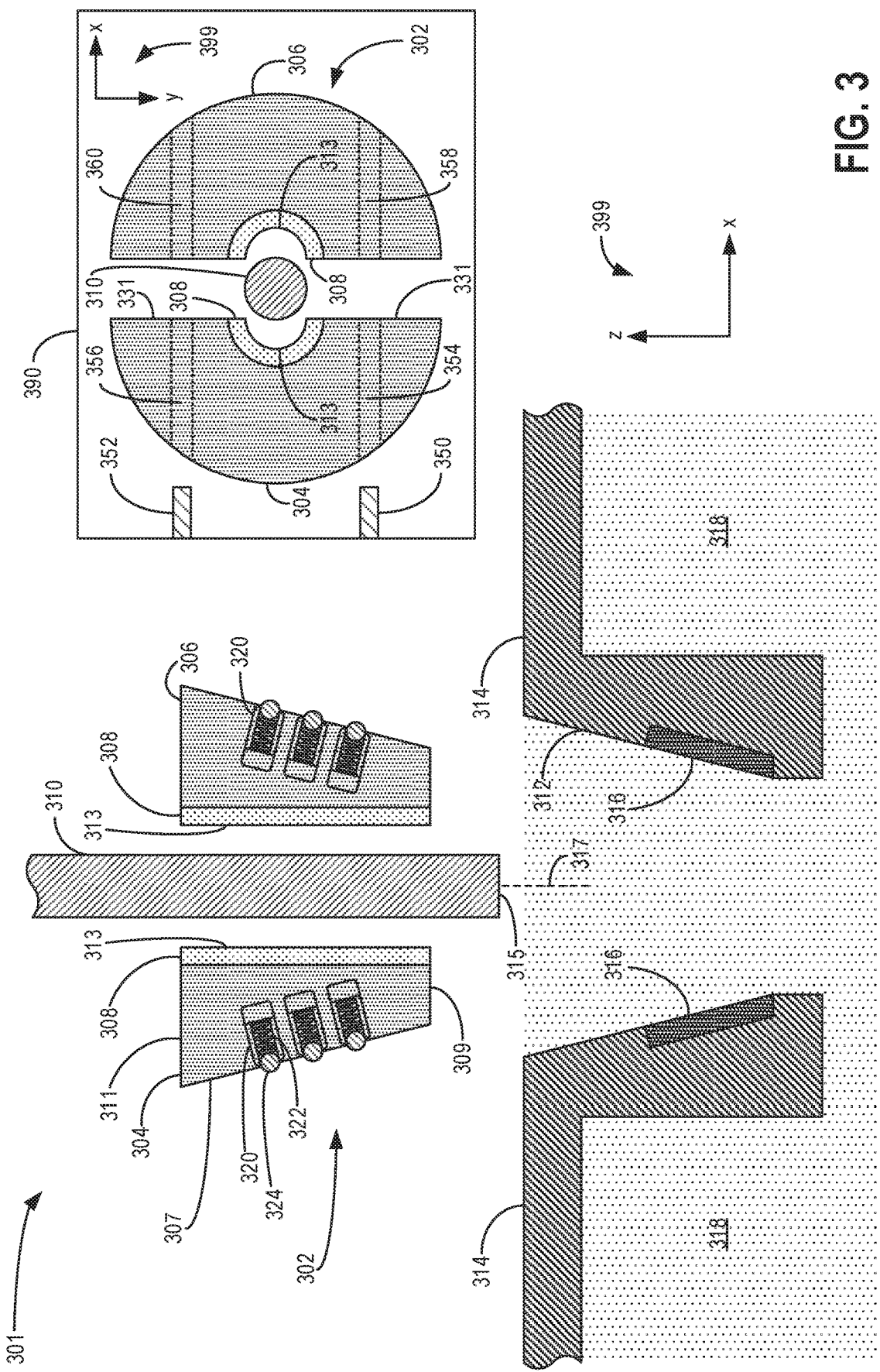
FIG. 3 shows a cross-sectional view of a second embodiment of sealing system for a DNP system, with a tapered seal of the sealing system decoupled from a fluid passage, according to an embodiment of the invention.
Figure 4:
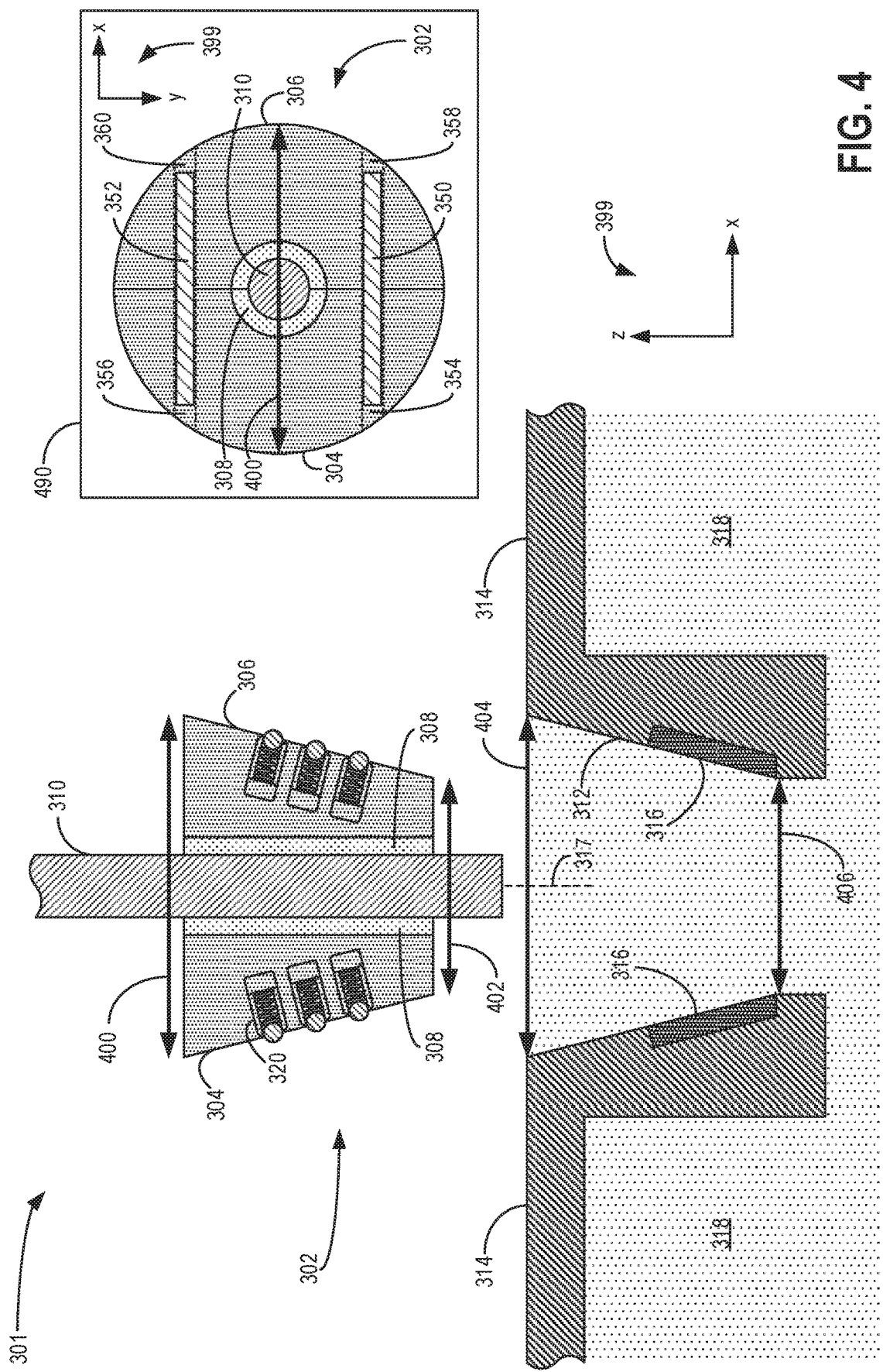
FIG. 4 shows a cross-sectional view of the tapered seal of FIG. 3 coupled to the fluid passage, according to an embodiment of the invention.
Figure 5:
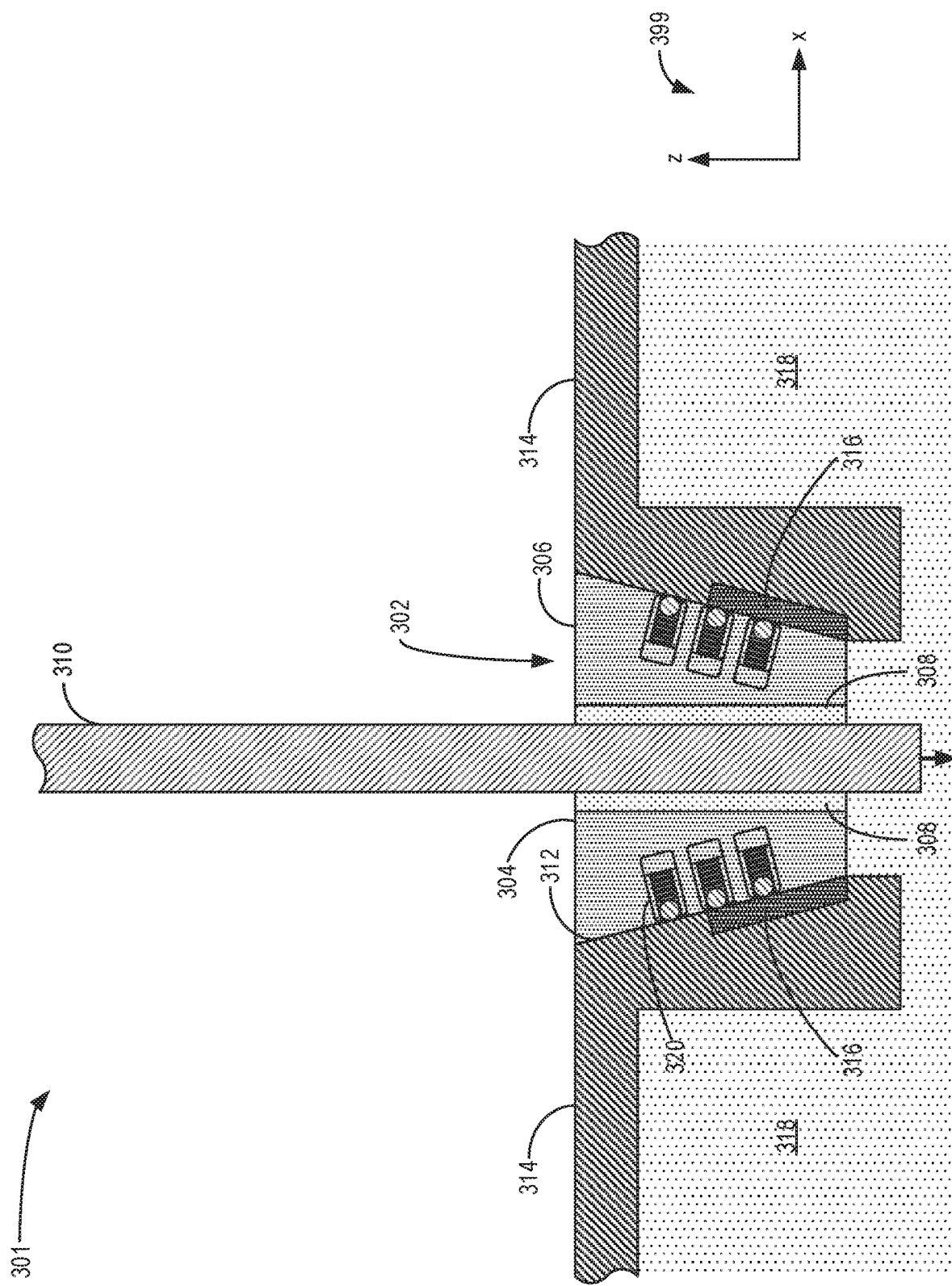
FIG. 5 shows a cross-sectional view of the tapered seal of FIGS. 3-4 coupled to the fluid passage and an inlet opening of a vacuum chamber, according to an embodiment of the invention.
Figure 6:
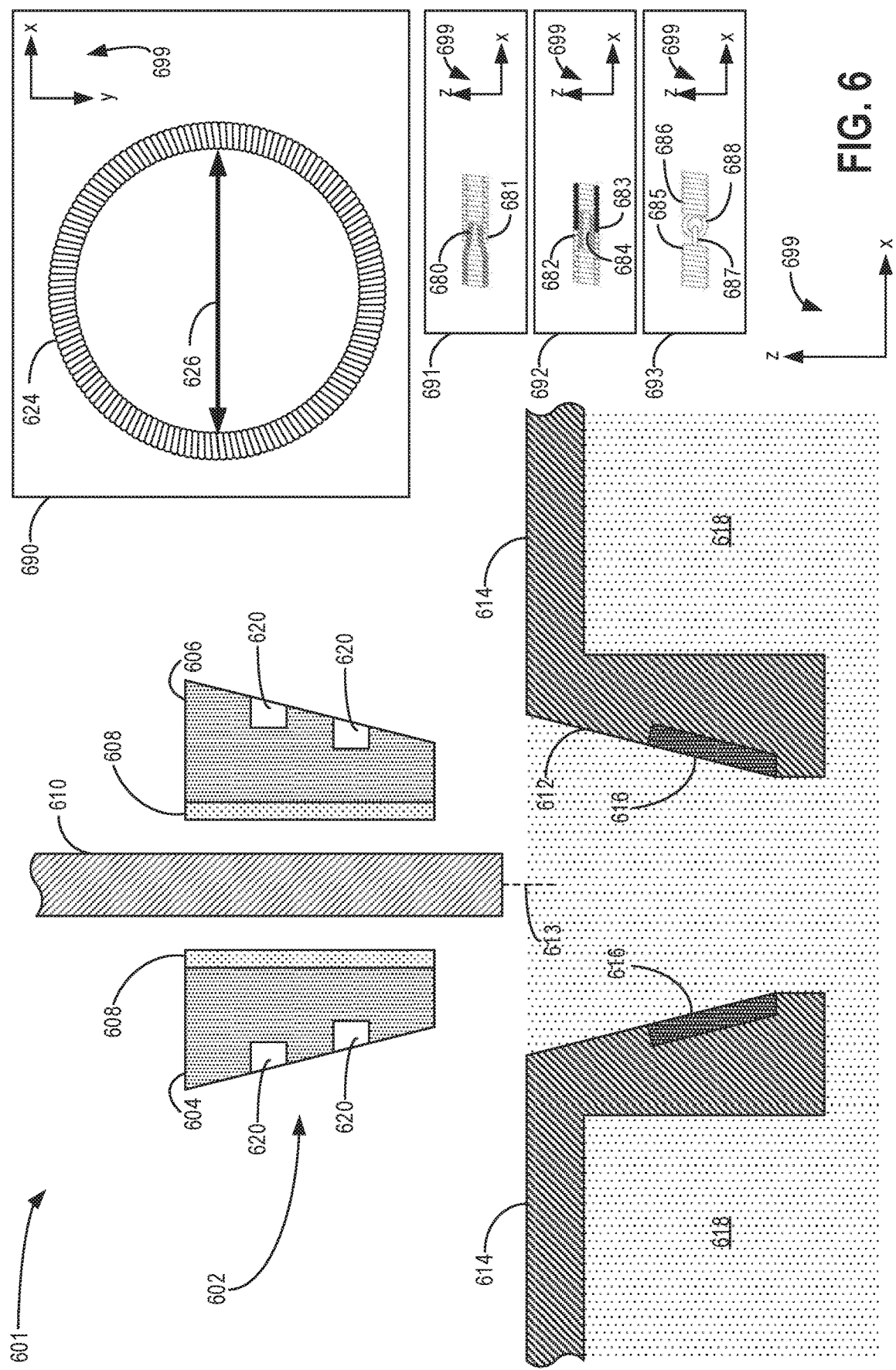
FIG. 6 shows a cross-sectional view of a third embodiment of a sealing system for a DNP system, with a tapered seal of the sealing system decoupled from a fluid passage, according to an embodiment of the invention.
Figure 7:
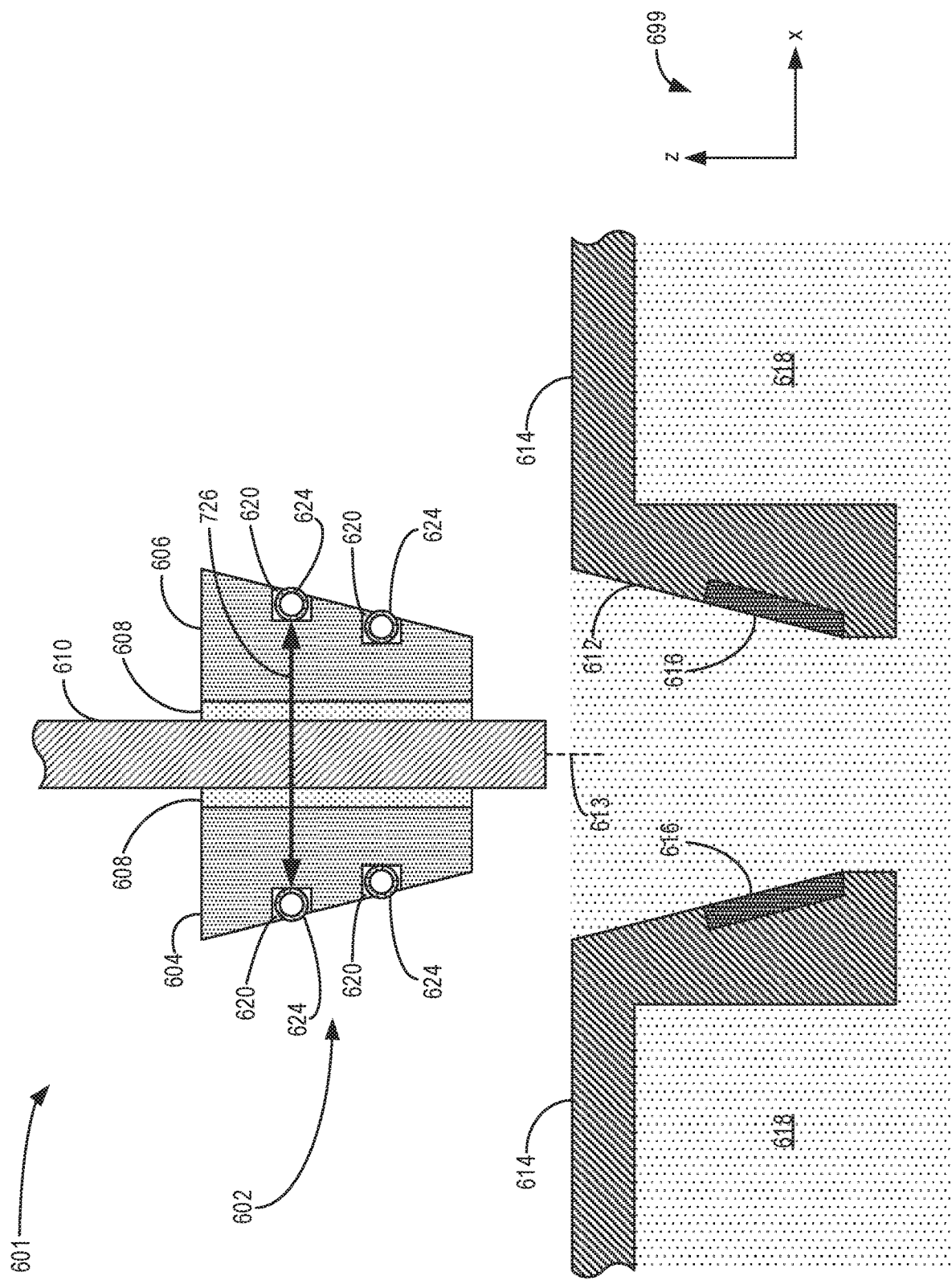
FIG. 7 shows a cross-sectional view of the tapered seal of FIG. 6 coupled to the fluid passage, according to an embodiment of the invention.
Figure 8:
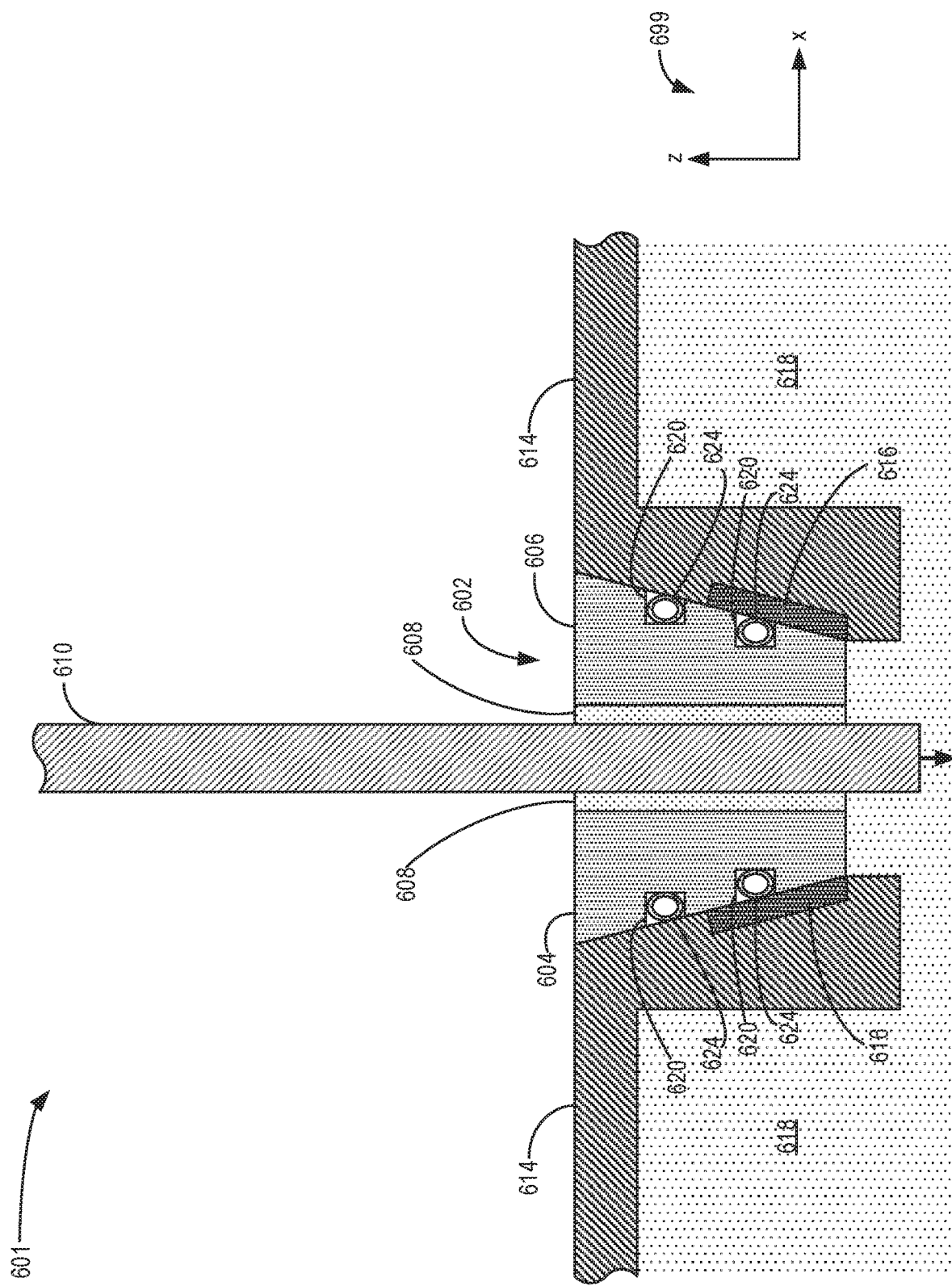
FIG. 8 shows a cross-sectional view of the tapered seal of FIGS. 6-7 coupled to the fluid passage and an inlet opening of a vacuum chamber, according to an embodiment of the invention.
Figure 9:
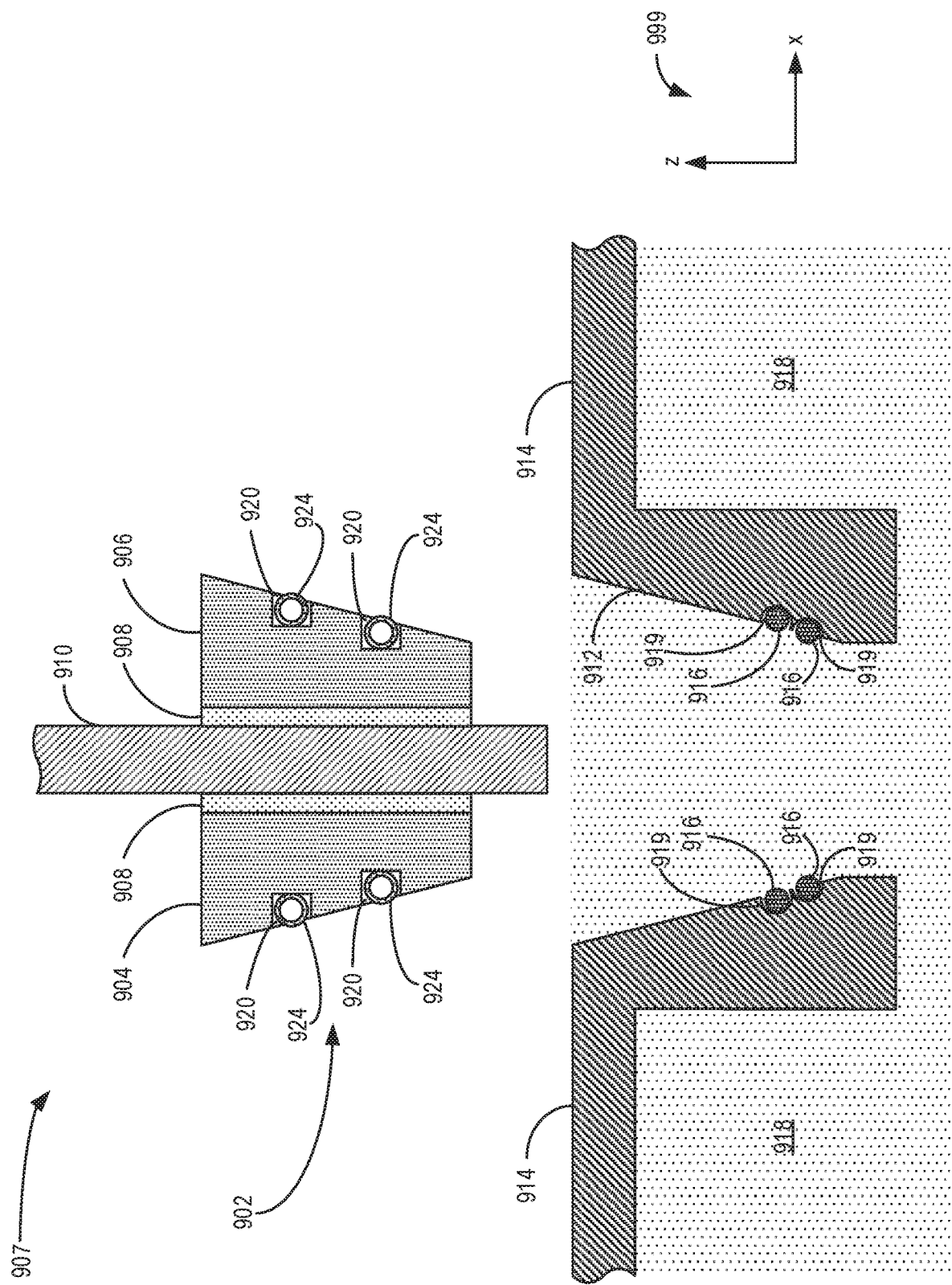
FIG. 9 shows a cross-sectional view of a fourth embodiment of a sealing system for a DNP system, with a tapered seal of the sealing system coupled to a fluid passage and decoupled from an inlet opening of a vacuum chamber, according to an embodiment of the invention.
Figure 10:
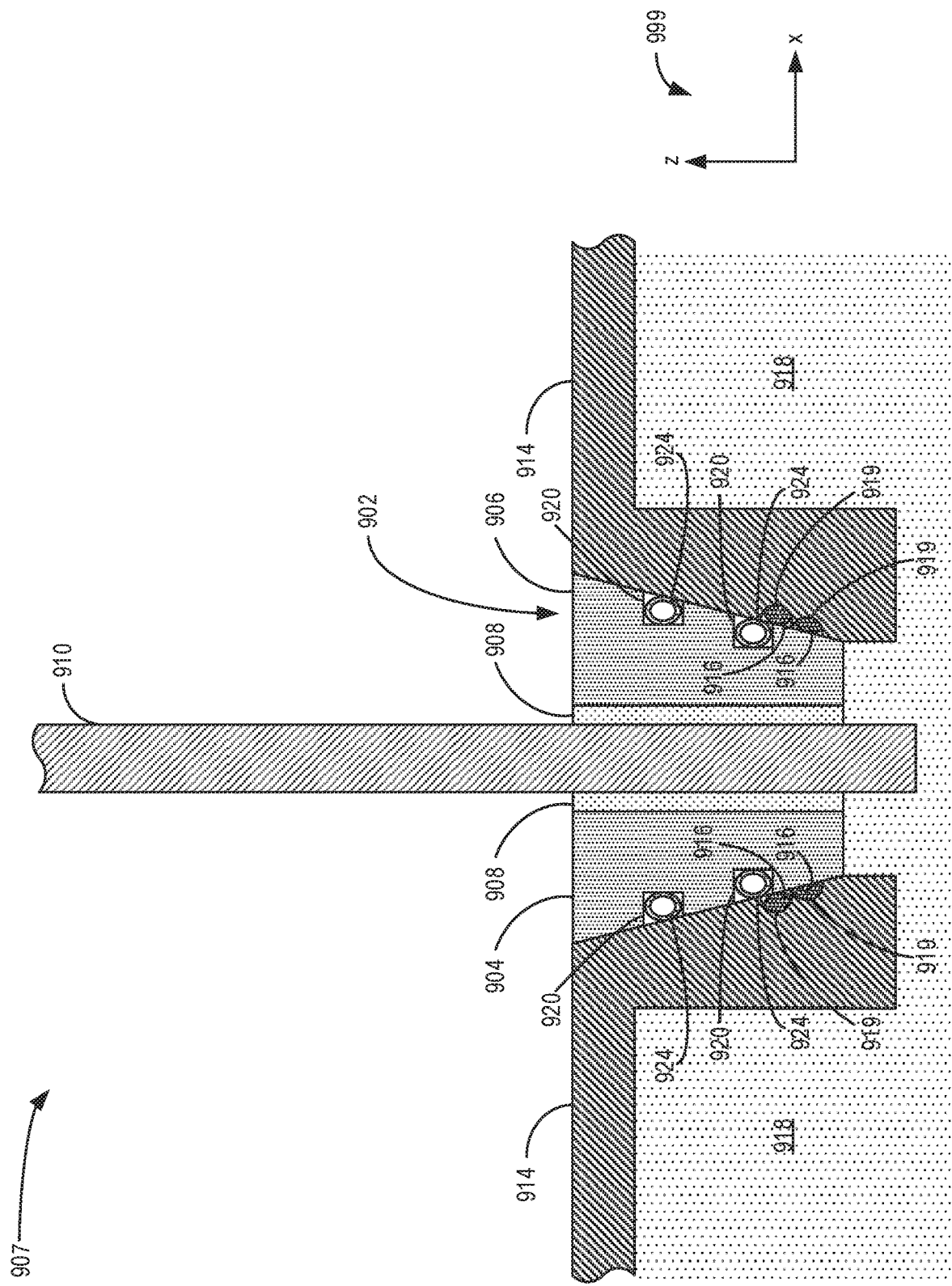
FIG. 10 shows a cross-sectional view of the tapered seal of FIG. 9 coupled to the fluid passage and coupled to the inlet opening of the vacuum chamber, according to an embodiment of the invention.
Figure 13:
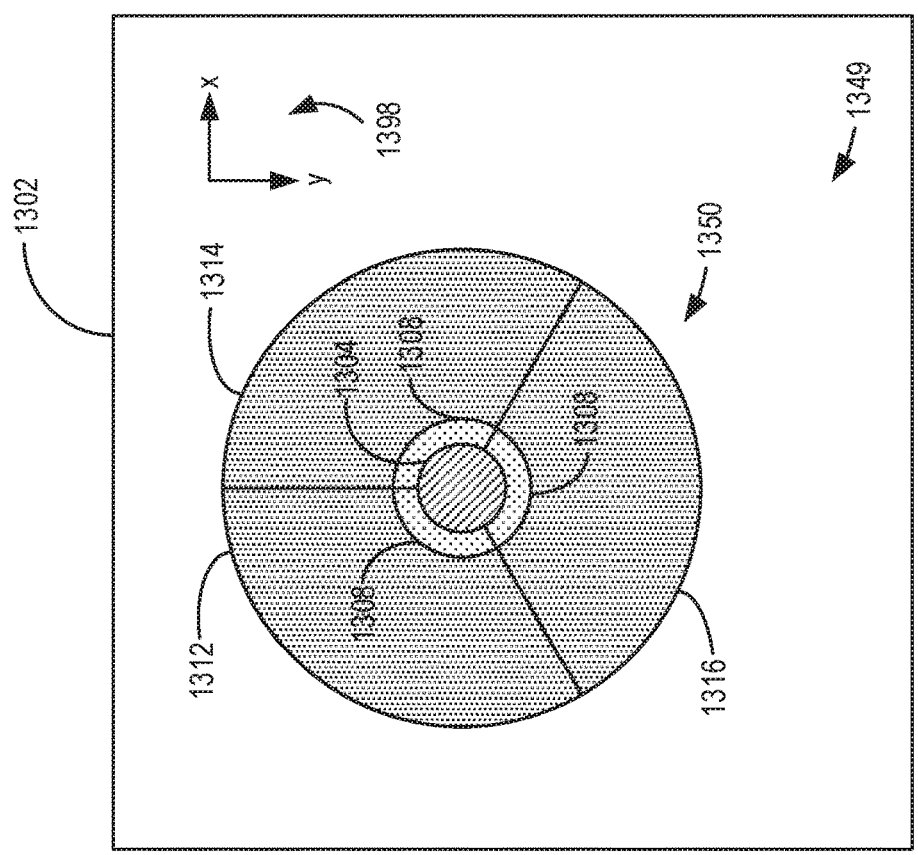
FIG. 13 shows a top view of a sixth embodiment of a sealing system including a tapered seal, according to an embodiment of the invention.
Figure 13:
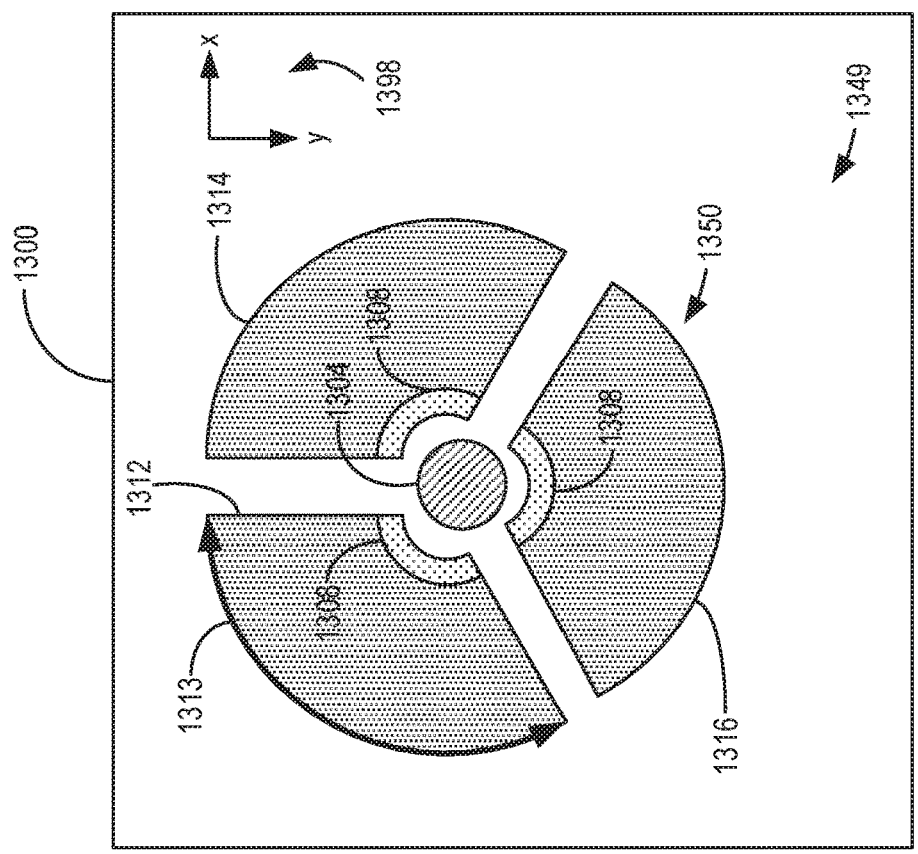
Figure 14:
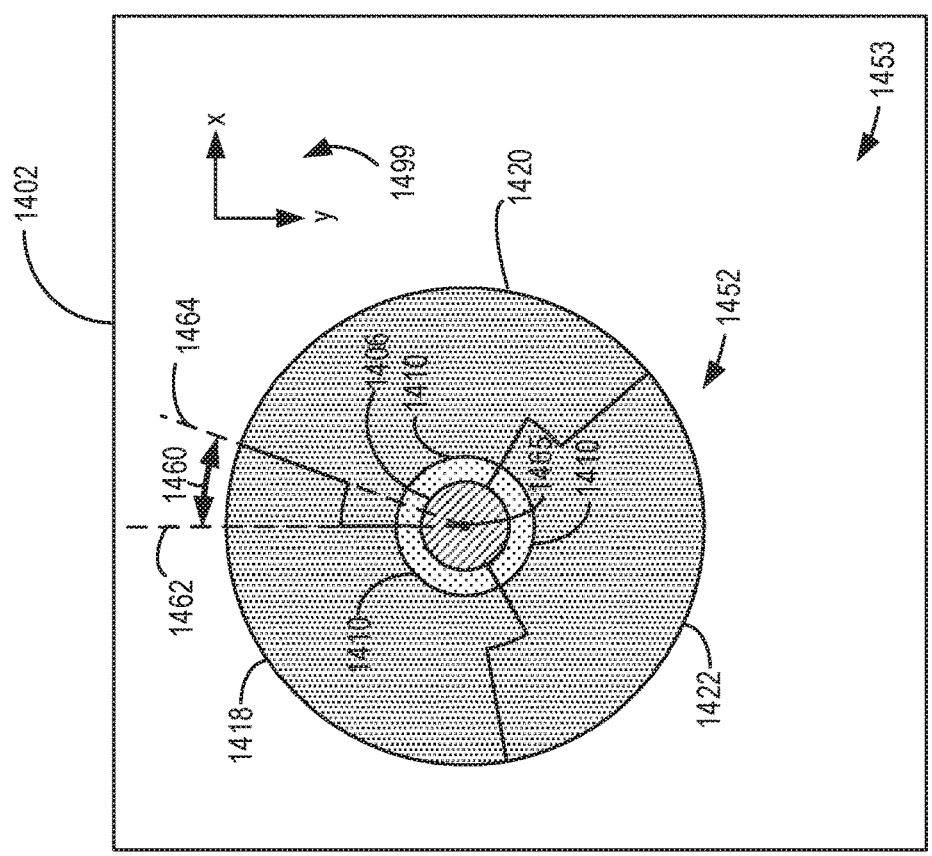
FIG. 14 shows a top view of a seventh embodiment of a sealing system including a tapered seal, according to an embodiment of the invention.
Figure 14:
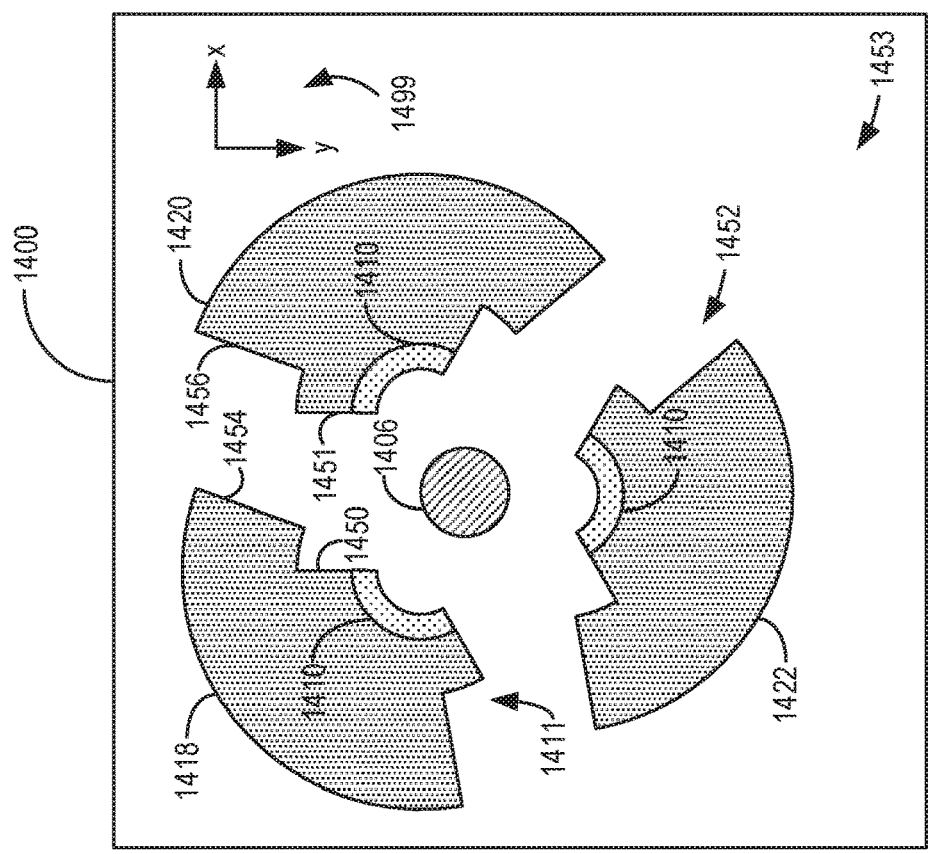
Figure 15:
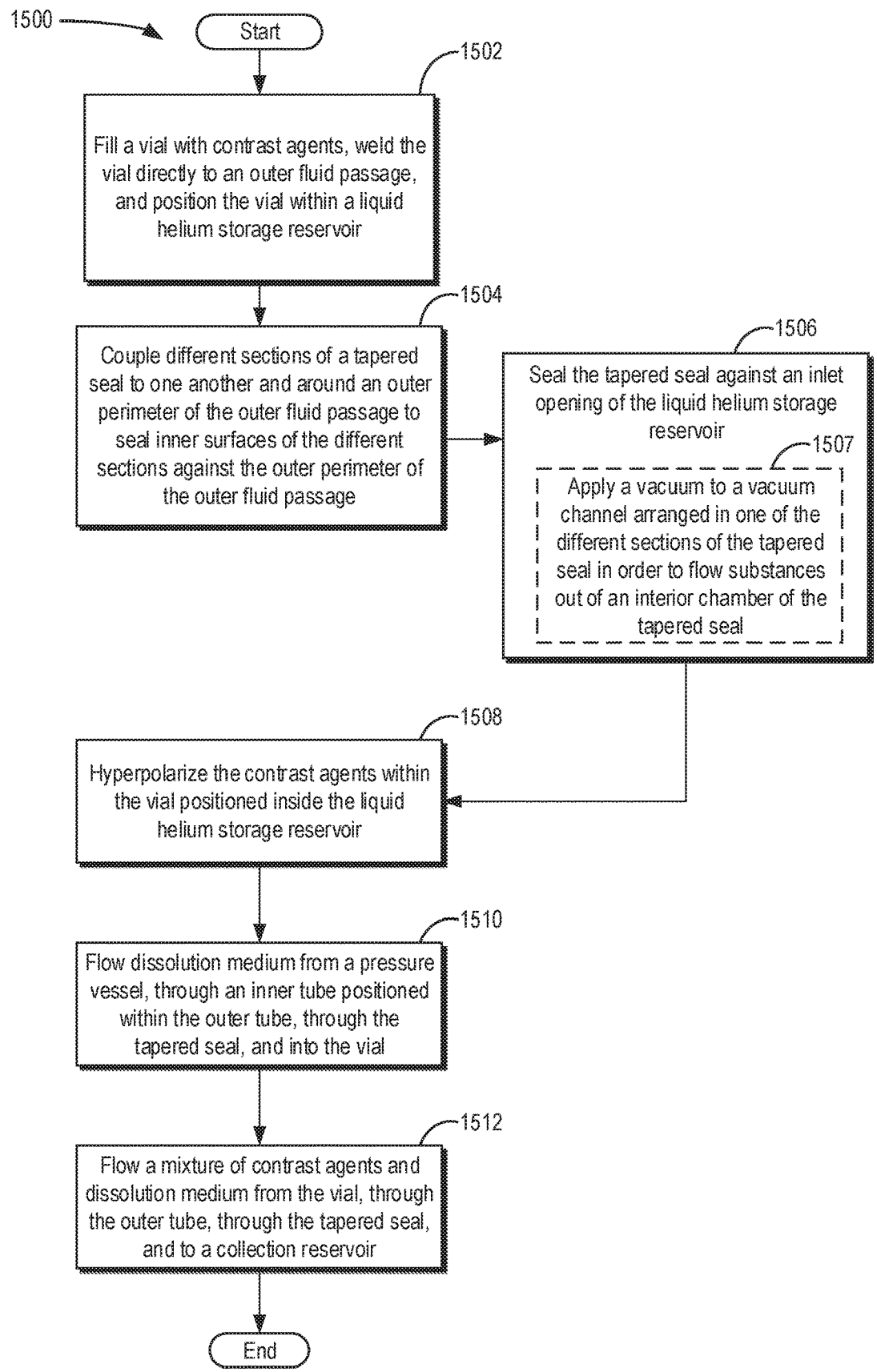
FIG. 15 illustrates a method of operating a sealing system of a DNP system, according to an embodiment of the invention.

The following description relates to various embodiments of diagnostic medical imaging systems. In particular, systems and methods are provided for a sealing system for a dynamic nuclear polarization (DNP) system. A DNP system, such as the DNP system shown by FIG. 1, includes a sealing system (which may be referred to herein as a dynamic seal assembly) configured to seal an inlet opening of a liquid helium storage reservoir and reduce a flow of atmospheric air into the reservoir. The sealing system, such as the sealing system shown by FIG. 2, includes a tapered seal formed from two or more separable and distinct sections, with each section coupling to each other section to encircle a fluid passage positioned within a through-hole of the tapered seal. The tapered seal may couple with the inlet opening to seal the reservoir, and fluid may flow within the fluid passage into and/or out of the reservoir through the tapered seal. In some examples (as shown by FIGS. 3-5), each section of the tapered seal may include one or more radial biasing members configured to couple the tapered seal to the inlet opening. In other examples (as shown by FIGS. 6-8), the sections of the tapered seal may be coupled together via one or more spring coils encircling an outer perimeter of the tapered seal, and the spring coils may press against the inlet opening to couple the tapered seal to the inlet opening. In yet other examples, the inlet opening may include a plurality of surfaces biased toward the tapered seal by biasing members (as shown by FIGS. 9-10), and/or the inlet opening may include a plurality of annular gaskets configured to increase an amount of friction between the tapered seal and the inlet opening. In some embodiments, the tapered seal may be formed by more than two sections (as shown by FIG. 13), and/or may include a plurality of tangential slots and protrusions shaped to engage each section with each other section (as shown by FIG. 14). A method for coupling the tapered seal to the fluid passage and inlet opening and flowing fluids within the fluid passage through the tapered seal while maintaining the tapered seal sealed against surfaces of the fluid passage and inlet opening is shown by FIG. 15.

In some examples, each section of the tapered seal may include a first plurality of toothed surfaces shaped to engage with corresponding toothed surfaces of each other section of the tapered seal, as shown by FIGS. 16A-16B. The tapered seal may additionally include a second plurality of toothed surfaces formed by inner surfaces of each section and shaped to seal the tapered seal against the outer perimeter of the fluid passage, as shown by FIG. 17. One or more vacuum channels extending through a section of the tapered seal (as shown by FIGS. 18A-18C) are adapted to be coupled to a vacuum source (as shown by FIG. 19) in order to flow fluids and/or particles out of an interior chamber of the tapered seal.

By forming the tapered seal from two or more sections, the tapered seal may be coupled around the fluid passage without inserting a tip of the fluid passage through the through-hole of the tapered seal. Coupling the tapered seal to the fluid passage in this way may reduce a likelihood of contamination (e.g., de-sterilization) of the fluid passage and the tapered seal. The tapered seal may be removed from the fluid passage for cleaning, replacement, etc. without coming into contact with the fluid within the fluid passage and/or removing a vial coupled to an end of the fluid passage, thereby enabling the tapered seal to be a re-usable component of the sealing system and reducing an operating cost of the sealing system relative to sealing systems that include disposable seals. By positioning the second plurality of toothed surfaces against the outer perimeter of the fluid passage, the toothed surfaces may slide against outer surfaces of the fluid passage in order to dislodge particles and/or fluids that may be adhered to the outer surfaces, and by flowing the particles and/or fluids out of the interior chamber of the tapered seal via the one or more vacuum channels, a likelihood of contamination of components of the DNP system (e.g., the vial) may be reduced. Additionally, flowing the particles and/or fluids out of the interior chamber of the tapered seal may increase a sealing quality of the tapered seal against the fluid passage by reducing a pressure within the interior chamber relative to atmospheric pressure.

Though a DNP system is described by way of example, it should be understood that the systems and methods of the present disclosure may also be useful when applied to systems utilized for other imaging modalities. The present discussion of a DNP system is provided merely as an example of one suitable imaging system.

Figure 1:
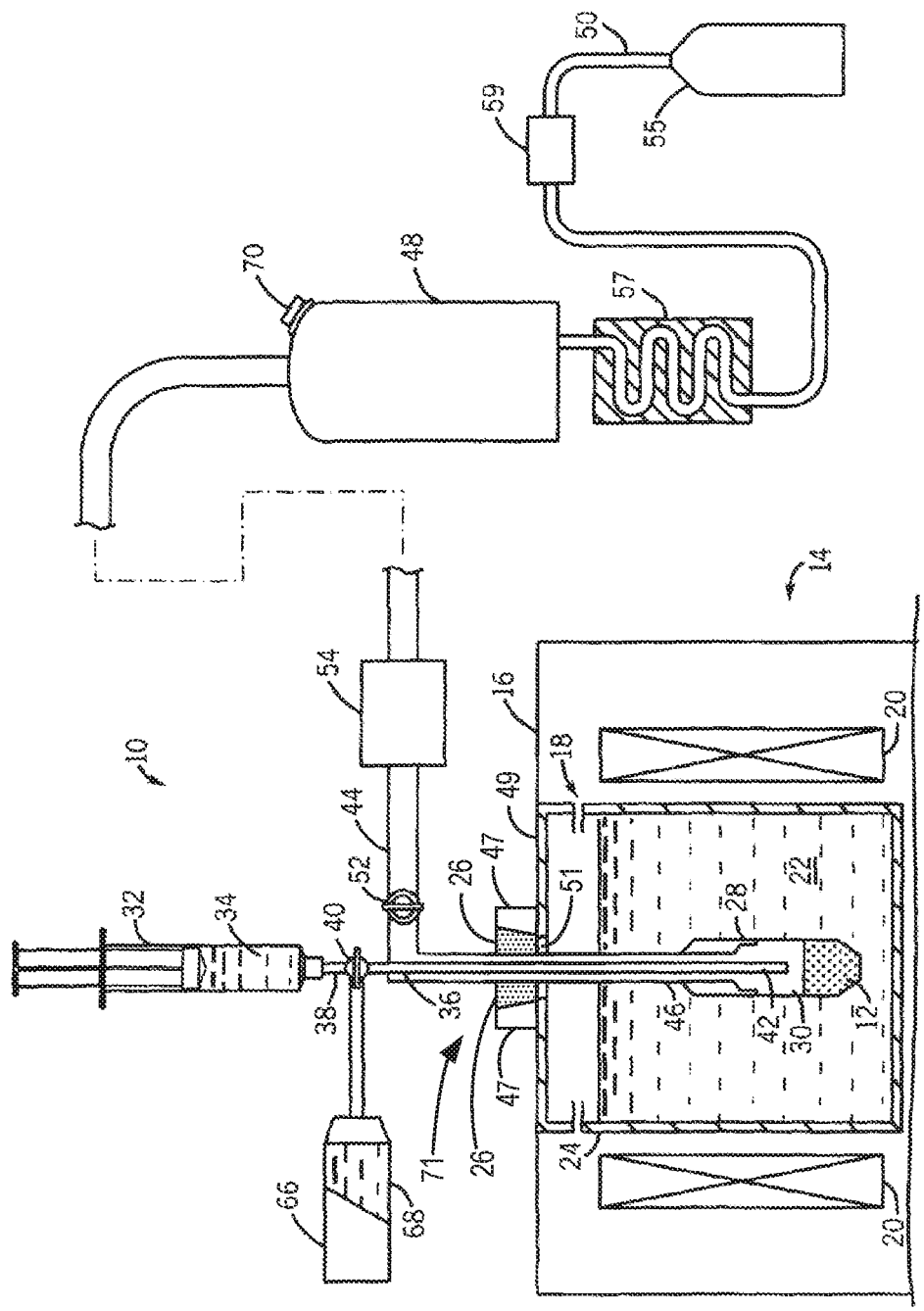
FIG. 1 shows a schematic depiction of a DNP system including a sealing system having a tapered seal, according to an embodiment of the invention.

Referring to FIG. 1, a dynamic nuclear polarization (DNP) system 10 (which may be referred to herein as a fluid delivery system) including a sealing system 71 is shown for dissolution and transport of a pharmaceutical product. In one embodiment, the pharmaceutical product is a sample 12 of solid hyperpolarized material for use as an imaging agent in magnetic resonance imaging (MM) and/or nuclear magnetic resonance (NMR) spectroscopy. For example, sample 12 can be composed of 13C1-pyruvic acid and electron paramagnetic agent (EPA), although other imaging agents are also possible. Sample 12 may be contained within a vial 28. The DNP system 10 may include components made from medical grade materials (e.g., for use a clinical setting) for preparing and delivering an injectable solution to patients. Such materials are known and are generally plastics of validated quality in terms of leachables and stability. The materials for components of the DNP system 10 may be further selected on a basis of their thermal, mechanical, and chemical properties to be compatible with the product and environment. For example, components of the DNP system 10 (e.g., vial 28) may be formed of materials resistant to cryogenic and/or superheated temperatures, higher pressures, etc.

The DNP system 10 provides a sterile barrier to the sample 12 and the resulting solution via sealing system 71.

Assemblies and parts of the DNP system 10 and sealing system 71 are configured to prevent a user of the DNP system 10 (e.g., technician, operator, etc.) from unintentionally breaking the sterile barrier. In particular, the sealing system 71 of the DNP system 10 includes a tapered seal 26 formed from two or more sections (as described further below with reference to the embodiments shown by FIGS. 3-14). The sections of the tapered seal 26 are removably coupled with each other so that the tapered seal 26 may be assembled to surround a fluid passage (e.g., outer tube 44, described below) of the DNP system 10 without coming into face-sharing contact with an opening of the fluid passage positioned at a tip of the fluid passage. In this way, the fluid passage may be coupled with the tapered seal 26 without inserting the tip of the fluid passage through the tapered seal 26, which may reduce a likelihood of contamination (e.g., de-sterilization) of the sample 12 coupled to the fluid passage. Example tapered seals (similar to tapered seal 26) are described below with reference to FIGS. 2-14.

DNP system 10 is integrated with a polarizer apparatus 14 for hyperpolarizing the sample 12. The polarizer apparatus 14 includes a vacuum chamber 16 that surrounds internal components of the polarizer apparatus 14. Positioned within the vacuum chamber 16 is a cryogenic cooling system 18 for cryogenically cooling the sample 12 (e.g., 13C1-pyruvic acid and EPA). A superconducting magnet 20 is also positioned within the vacuum chamber 16, and the superconducting magnet 20 and cryogenic cooling system 18 may together be utilized to hyperpolarize the sample 12. In the embodiment shown by FIG. 1, the cryogenic cooling system 18 includes a liquid helium bath 22 housed in container 24 (which may be referred to herein as a liquid helium storage reservoir) to form a cryogenically cooled chamber. In some examples, the liquid helium bath 22 may be at a temperature less than 4 Kelvin. The sample 12 is immersed in the liquid helium bath 22 and a magnetic field is produced by superconducting magnet 20 in order to provide conditions for hyperpolarizing the sample 12. Microwave irradiation at an appropriate frequency is provided by a microwave radiation source (not shown) to polarize the sample 12 by Dynamic Nuclear Polarization (DNP).

A portion of DNP system 10 extends down into container 24 of the polarizer apparatus 14. This positioning enables sample 12 and vial 28 to be exposed to the high magnetic field and cryogenic temperatures of the polarizer apparatus 14. To retain a vacuum within vacuum chamber 16 (and within a portion of the container 24 not filled by the liquid helium bath 22), the tapered seal 26 is coupled to an opening 51 (which may be referred to herein as an inlet opening) of the vacuum chamber 16. In one example, the opening 51 is formed by a protruding portion 47 of an exterior top surface 49 of the vacuum chamber 16. The opening 51 is fluidly coupled with the container 24 (e.g., opening 51 forms a junction or interface with container 24). The tapered seal 26 includes a central opening (e.g., aperture) shaped such that a portion of the DNP system 10 (e.g., outer tube 44, which may be referred to herein as an outer passage) may traverse through the tapered seal 26 and into the container 24. However, during conditions in which the tapered seal 26 is coupled to the vacuum chamber 16 (e.g., coupled to the protruding portion 47 to seal opening 51), fluids (e.g., air, liquid helium, etc.) may not flow into (or out of) the container 24 across outer surfaces of the tapered seal 26. Thus, the tapered seal 26 maintains the vacuum without vacuum chamber 16 and so that polarizer apparatus 14 may be utilized to hyperpolarize the sample 12. In some examples, the vacuum chamber 16 and container 24 may be formed together as a single piece. For example, the container 24 may be positioned within the vacuum chamber 16, and the vacuum chamber 16 and container 24 may share one or more walls/surfaces (e.g., exterior top surface 49, protruding portion 47, and opening 51).

During conditions in which the fluid passage (e.g., outer tube 44) is coupled with the tapered seal 26 and held in a fixed position relative to the tapered seal 26, the tapered seal may move (e.g., slide) along a length of the fluid passage. In order to reduce an amount of friction between the tapered seal 26 and the fluid passage, the central opening of the tapered seal 26 may include a lining formed of a material with a relatively lower coefficient of friction (e.g., polytetrafluoroethylene). In one example, the sections of the tapered seal 26 may be assembled around the fluid passage (as described above) in order to couple the tapered seal 26 with the fluid passage (e.g., to position the fluid passage within the central opening of the tapered seal 26). The tapered seal 26 may then be coupled with the protruding portion 47 to seal the opening 51 of the vacuum chamber 16. In this configuration, the tapered seal 26 does not move relative to the vacuum chamber 16. The fluid passage coupled with the tapered seal 26 may then be moved (e.g., by a user of the DNP system 10) in order to slide the fluid passage relative to the tapered seal 26 and vacuum chamber 16 (e.g., to adjust a position of the fluid passage within the container 24).

During operation of the polarizer apparatus 14, the tapered seal 26 may be coupled with the vacuum chamber 16 to seal the opening 51 and to enable the vial 28 to be interfaced with the polarizer apparatus 14 (e.g., to enable the vial 28 to be positioned within the helium bath 22) without reducing vacuum within the vacuum chamber 16 and the container 24. In certain embodiments, the length of the outer tube 44 which may traverse the tapered seal 26 in a direction toward the liquid helium bath 22 to enable the positioning of the vial 28 within the liquid helium bath 22 is approximately between 10 centimeters and 100 centimeters. During extraction of the DNP system 10 from the polarizer apparatus 14, the outer tube 44 traverses the tapered seal 26 in an opposite direction (e.g., away from the liquid helium bath 22). Although the vial 28 is positioned within the liquid helium bath 22, the vial 28 is fluidly isolated from the liquid helium bath 22 and vacuum chamber 16 by the outer tube 44. For example, the outer tube 44 may be welded to the vial 28 in order to prevent liquid helium from the liquid helium bath 22 from flowing into the vial 28 (and to prevent the sample 12 from being released into the liquid helium bath 22.

The tapered seal 26 may be coupled to the fluid passage at a position between the vial 28 and fluid passage valves 40 and 52. In certain embodiments fluid passage valves 40 and 52 may be configured as a single valve system that operates to restrict flow independently in inner tube 36 and outer tube 44.

The tapered seal 26 includes several characteristics to enable positioning of the sample 12 in the liquid helium bath 22 without degrading the performance of the polarizer apparatus 14. The tapered seal 26 may constrict against surfaces of the outer tube 44 sufficiently to create a vacuum tight barrier. In certain embodiments, a leak rate of air around the outer surfaces of the tapered seal 26 may be less than or equal to approximately 2.5 milliliters per hour of air to reduce changes to the internal pressure of the container 24 and to reduce a likelihood of the formation of ice within the polarizer apparatus 14. As described above, the tapered seal 26 presents a low friction interface with the outer tube 44 to enable the flexible inner tube 36 and outer tube 44 to traverse the tapered seal 26 without bending, buckling or damaging the tubes. In some examples, an amount of force applied (e.g., by a user of the DNP system 10) to cause the outer tube 44 to traverse the tapered seal 26 may not exceed 25 newtons.

Furthermore, the tapered seal 26 is capable of operation at cryogenic temperatures. In certain embodiments, during extraction of the outer tube 44 from the liquid helium bath 22, portions of the outer tube 44 may have been cryogenically cooled by the liquid helium bath 22. As such, the tapered seal 26 is configured to maintain integrity (e.g., maintain its ability to seal the opening 51) when exposed to low temperatures (e.g., temperatures associated with cryogenic freezing). For example, the tapered seal 26 may be formed of one or more materials (e.g., nylon, polytetrafluoroethylene, machineable glass-ceramics, polyimide-based plastics, polyether ether ketone, etc.) that have an increased resistance to temperatures of approximately 10 Kelvin.

The sample 12 positioned within polarizer apparatus 14 is contained in vial 28 (e.g., sample container). Vial 28 is formed of a material that is non-reactive to the sample and to other commonly used solvents or solutions that might be used to dissolve the sample 12. For example, the vial 28 can be formed of glass, polymer or another suitable material that would not react with sample 12 or a dissolution medium. Some examples of suitable polymers include (but are not limited to) polyetherimide, polysulfone and polyetheretherketone. A specified quantity or dosage of sample 12 is included in vial 28 to be mixed with a dissolution medium solution and ultimately injected into a patient. Typically, this quantity/dosage of sample 12 will be equal to or less than approximately 2 ml in volume. In some embodiments, the volume of the vial 28 may be increased to contain larger sample doses. The vial 28 is sized so that the quantity of sample 12 included therein fills a portion of an interior volume 30 of vial 28, with the frozen sample 12 being positioned at the bottom of vial 28. In some examples the sample 12 may be frozen in other positions in the vial 28, such as coating the walls of the vial to form, for example, a hollow cylinder of sample product.

The vial 28 is coupled to a portion of the DNP system 10 (e.g., outer tube 44) that extends down into container 24. In operation, the DNP system 10 is used to dissolve the cryogenically frozen sample 12 by way of an aqueous solution and to transport this dissolved sample out from the container 24 to a desired end location (e.g., via outer tube 44), where, in certain applications, it may be injected into a patient. To provide an aqueous solution for dissolving sample 12 in vial 28, a pressure vessel 32 is included in the DNP system 10. In one embodiment, the pressure vessel is a syringe 32 that can be in the form of a motor powered or pneumatic syringe that produces force to inject a dissolution medium 34 (e.g., buffer solution) into DNP system 10. Dissolution medium 34 therein is in a heated state to melt and dissolve the cryogenically frozen sample 12 when mixed therewith. Depending on its composition, the dissolution medium 34 can be heated to a temperature of up to approximately 150° C. in a pressure chamber (not shown) or other suitable heating apparatus. The dissolution medium 34 includes a base solvent, such as sodium hydroxide, for neutralizing pyruvic acid, and may also include an ion chelator (e.g., EDTA). The dissolution medium 34 also includes therein a buffering agent, which commonly is in the form of a buffering salt such as TRIS, although other known buffering salts can also be used. While the dissolution medium 34 listed above is set forth as being composed of sodium hydroxide, EDTA, and TRIS, it is also envisioned that water or other solutions could be used instead.

The inner tube 36 is attached (e.g., coupled) to syringe 32 and forms a dissolution fluid passage between the syringe 32 and vial 28 containing the sample 12. An input end 38 of inner tube 36 connects to the syringe 32 in a sealed manner. Also positioned near the input end 38 of the inner tube 36, and adjacent to syringe 32, is dissolution fluid passage valve 40 coupled to inner tube 36. The fluid passage valve 40 functions to control a fluid flow of the dissolution medium 34 out from syringe 32 and into the inner tube 36 and enables a measured amount of dissolution medium 34 to be injected into the DNP system 10 for dissolving sample 12 and controlling pH of the resulting hyperpolarized solution. An output end 42 of the inner tube 36 extends down into the interior volume 30 of vial 28 and is thus in fluid communication therewith. The inner tube 36 is preferably composed of a material having a low thermal conductivity so as to maintain a temperature of the dissolution medium 34 and to reduce the loss of thermal energy therefrom as it passes through inner tube 36 and down into vial 28. In operation, inner tube 36 delivers dissolution medium 34 in a heated state from syringe 32 down into vial 28. In the interior volume 30 of vial 28, the heated dissolution medium 34 comes into contact with frozen sample 12. The dissolution medium 34 dissolves the entirety of the sample 12 to form a mixture that forms a hyperpolarized solution. The resulting hyperpolarized solution is in the form of an intravenous solution that can be directly injected into a patient as approved by qualified health authorities.

Outer tube 44 (which may be referred to herein as a delivery fluid passage) is included in DNP system 10 and forms a separate fluid passage from inner tube 36. In one embodiment, and as shown in FIG. 1, inner tube 36 is positioned within outer tube 44. In other embodiments, other arrangements could be implemented, such as a side-by-side configuration between the tubes 36, 44 where both are coupled to vial 28 through a pair of openings within the tapered seal 26. The outer tube 44 is formed of a low conductivity material, the material preferably having a different thermal conductivity than inner tube 36, to prevent heat transfer between inner tube 36 and outer tube 44, and to prevent heat transfer between outer tube 44 and the surrounding environment of container 24 (and the low temperatures present therein due to liquid helium bath 22). A first end 46 of outer tube 44 is hermetically sealed to vial 28 to form a fluid connection therebetween that is free of leaks. As stated above, a hyperpolarized solution is formed from the dissolution medium 34 and the dissolved sample 12 and is contained in the interior volume 30 of vial 28. As more dissolution medium 34 is injected into inner tube 36 and down into vial 28 to dissolve sample 12, the quantity of hyperpolarized solution increases and is forced out of vial 28. The hyperpolarized solution thus flows up into outer tube 44 forming an outer fluid passage for transport of the hyperpolarized solution. The hyperpolarized solution flows through outer tube 44 and into a receiving vessel 55 (e.g., flask) attached to a second end 50 of outer tube 44, where it collects until the desired amount of hyperpolarized solution has been collected. Outer tube 44 can be integrally connected to, or separately fitted on, receiving vessel 55 and can also include a nozzle (not shown) on second end 50 that enters into receiving vessel 55. In certain embodiments the first end 46 may be configured as a separate tube from outer tube 44 and may be oriented in series with outer tube 44 (e.g., coupled with outer tube 44 such that fluid flows directly from the separate tube to outer tube 44).

To control flow of the hyperpolarized solution between vial 28 and receiving vessel 55, fluid passage valve 52 is placed within outer tube 44. In one embodiment, fluid passage valve 52 is positioned proximate to syringe 32. In some embodiments, the fluid passage valve 52 reduces the flow of air or liquid from a holding container 48 into outer tube 44 and vial 28. This flow may be induced by temperature induced pressure differentials within DNP system 10 due to the cryogenic cooling of vial 28.

The fluid passage valve 52 may be disposable and may be replaced in the DNP system 10 (e.g., during maintenance and/or repair of the DNP system 10). Also coupled to outer tube 44 is a filter cartridge 54 that removes an electron paramagnetic agent (EPA) from the hyperpolarized solution and possibly other processing agents that may have been added to hyperpolarize the sample 12. The filter cartridge 54 removes the EPA from the hyperpolarized solution to make it suitable for injection. Furthermore, EPA filter cartridge may function as a heat sink to cool the hyperpolarized solution down to a lower temperature more suitable for injection into the patient.

After passing through filter cartridge 54, the hyperpolarized solution flows through outer tube 44 and optionally into holding container 48, where it can be held for a short time for mixing and/or automated quality control tests (if desired by the user of the DNP system 10). In one embodiment, further cooling of the hyperpolarized solution may be performed in holding container 48 by reducing pressure therein and/or by diluting the solution with a quantity of water for injection (e.g., 10 ml) that is at a temperature suitable for injection (e.g., room temperature). The water may already be present in holding container 48 or may be added thereto upon the accumulation of the hyperpolarized solution. The pressure reduction and the addition of the water may provide further cooling to bring the temperature of the resulting hyperpolarized solution from approximately 80° C. to approximately 50° C. (for example), although it is also envisioned that the temperature of the solution can be brought down even further via these methods to a temperature point suitable for injection (e.g. approximately 38° C.).

After mixing and cooling of the hyperpolarized solution, the solution is forced out from holding container 48 and travels down outer tube 44 to the receiving vessel 55 (e.g., flask) before final injection into a patient. It is envisioned that a heat exchanger 57 may be coupled to outer tube 44 between holding container 48 and receiving vessel 55 to further cool the hyperpolarized solution down to a temperature threshold set at 38° C. (for example) for injection of the solution into the patient. As stated above, in some examples, the temperature of the hyperpolarized solution may be in the range of 50° C. when it flows out of the holding container 48.

As the hyperpolarized solution remains in its hyperpolarized state for a short time period (e.g., approximately 1 minute), in certain embodiments, as shown in FIG. 1, an optional heat exchanger 57 may be used. The heat exchanger 57 enables further cooling of the solution in a quick and efficient manner. The heat exchanger 57 is constructed in part of a material having increased heat conduction properties (e.g., copper) to enable for the solution to pass through the heat exchanger 57 in a decreased amount of time (e.g., having a high flow capacity) while still removing a large amount of heat therefrom. While copper provides the desired heat transfer properties, it is neither sterility nor liquid state polarization compliant. As such, the copper surfaces in heat exchanger 57 that are in contact with the hyperpolarized solution may be gold plated to form a more sterile and non-reactive fluid passage. To increase sterility of the injectable hyperpolarized solution, the heat exchanger 57 may be easily disassembled for cleaning, with all components and compartments in the heat exchanger being accessible. In some embodiments, the heat exchanger may include porous polymeric frits to increase a surface area of the heat exchanger 57. In one embodiment, the polymer may be polyethylene. In other embodiments, the polymeric frit based heat exchanger 57 may be disposable. As such, heat exchanger 57 may be formed from two detachable halves to accommodate easy assembly and disassembly, or some other similar configuration.

In some embodiments, heat exchanger 57 be a single use disposable part along with other components of the DNP system 10 (e.g., outer tube 44). In some embodiments, the heat exchanger 57 may be positioned between the filter cartridge 54 and the holding container 48. The heat exchanger 57 may not include areas where the hyperpolarized solution could become trapped so as to reduce a likelihood of a loss of the solution as it passes therethrough. As stated above, the heat exchanger 57 may be optional and its inclusion in DNP system 10 may depend on the temperature of the dissolution medium in syringe 32 and the thermal mass of other components in the system.

Upon exiting heat exchanger 57, the hyperpolarized solution may flow through outer tube 44 to a sterile filter 59. Filter 59 can be optionally added to DNP system 10 to further ensure sterilization of the hyperpolarized solution, although it is recognized that DNP system 10 is designed as a sterile system without the inclusion of filter 59. The filter 59 can be composed of a membrane and/or resin and can take the form of filters known in the art and as used for sterile filtering of intravenous solutions and injectable drugs. After exiting filter 59, the solution then passes into receiving vessel 55. Additional dissolution medium or water for injection can be added to receiving vessel 55 (or already be present in the receiving vessel 55) to mix with the hyperpolarized solution as desired to create a desired temperature, concentration, and/or pH level of the solution. The temperature, concentration, and pH of the hyperpolarized solution in receiving vessel 55 may then be measured by an operator to ensure it is at or below the threshold temperature of 38° C. (for example) and at a suitable pH and concentration for injection into the patient.

As set forth above, the inclusion of heat exchanger 57 and filter 59 in DNP system 10 is optional. In some examples the holding container 48 may also be optional. For example, some embodiments may omit the holding container 48 such that hyperpolarized solution flows directly to receiving vessel 55 without flowing through holding container 48. In other embodiments, the functions of holding container 48 may be implemented into receiving vessel 55. In yet other embodiments, additional dissolution medium or water for injection can be added to holding container 48 to mix with the hyperpolarized solution as desired to create a desired temperature, concentration, and/or pH level. The temperature, concentration, and pH of the hyperpolarized solution in holding container 48 may then be measured by an operator to ensure it is at or below the threshold temperature of 38° C. (for example) and at a suitable pH and concentration for injection into the patient.

To assist in dissolution of sample 12 in DNP system 10, in some embodiments a nozzle may be coupled to output end 42 of inner tube 36 and positioned, at least in part, within vial 28. The nozzle may aid in producing fluid flow characteristics in the dissolution medium 34 to completely and efficiently dissolve sample 12 and to force the resulting hyperpolarized solution out from vial 28 and into outer tube 44, toward holding container 48 and receiving vessel 55. In other embodiments, the DNP system 10 may not include the nozzle coupled to output end 42.

An optional vessel 66 containing an additional processing agent 68 may be included in DNP system 10 to aid in polarization of sample 12. In one embodiment, the additional processing agent 68 is a gadolinium solution. Prior to polarization of the sample 12, additional processing agent 68 is injected into inner tube 36 and down into vial 28 to aid and increase hyperpolarization of the sample 12. That is, before sample 12 is brought down to a cryogenic temperature by liquid helium bath 22, additional processing agent 68 is released from optional vessel 66, through fluid passage valve 40, which is configured as a 3-way valve, and forced into inner tube 36 by helium gas used to pressurize optional vessel 66. The additional processing agent 68 is forced down through inner tube 36 by this helium gas pressure and enters into vial 28 to mix with sample 12. The helium gas atmosphere present in vial 28 blankets the mixing of the additional processing agent 68 and sample 12 for proper mixing to occur. Any excess gas volume would be forced through a ventilation port present in the DNP system 10, such as a ventilation port 70 in holding container 48. Upon proper mixing of the additional processing agent 68 and sample 12, the prepared sample is brought down to a cryogenic temperature by liquid helium bath 22 and introduced into a magnetic field for hyperpolarization as described above. Inclusion of optional vessel 66 in DNP system 10 is optional. In some examples, optional vessel 66 may be included if a compound or ingredient is to be added to sample 12 before the polarization thereof.

The coupling of the tapered seal 26 around the outer tube 44 enables the outer tube 44 to be positioned within the polarizer apparatus 14 without reducing the sterility of the outer tube 44 and the sample 12. By forming the tapered seal 26 from sections shaped to couple around the outer tube 44, the tapered seal 26 may be decoupled from the outer tube 44 for replacement, cleaning, sterilization, etc. independently of the outer tube 44, and may therefore be a non-disposable (e.g., re-usable) component of the DNP system 10. For example, tapered seals that are formed of a single piece having a central opening may be difficult to decouple from the outer tube 44 without increasing a likelihood of contamination of the sample 12 (e.g., due to sliding the tip of the outer tube 44 through the central opening). As a result, in order to reduce a likelihood of contamination, the outer tube 44 and tapered seal formed of a single piece may be a disposable component (e.g., non-reusable) and may increase an operating cost of the DNP system. By assembling the tapered seal 26 from a plurality of sections as described above, the tapered seal 26 may be a non-disposable component (e.g., reusable or multi-use component) of the DNP system 10 and may reduce the operating cost of the DNP system 10.

Figure 11:
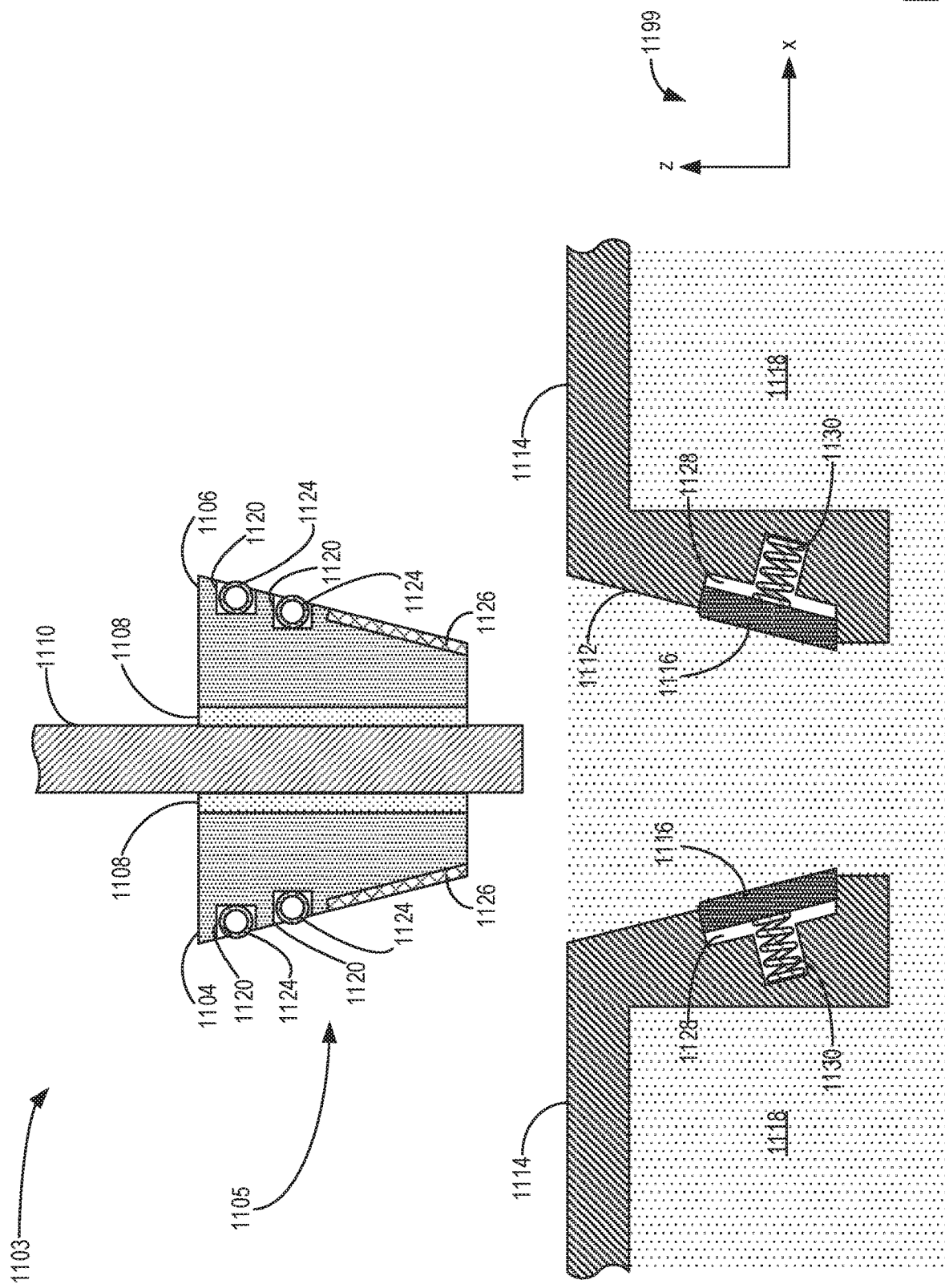
FIG. 11 shows a cross-sectional view of a fifth embodiment of a sealing system for a DNP system, with a tapered seal of the sealing system coupled to a fluid passage and decoupled from an inlet opening of a vacuum chamber, according to an embodiment of the invention.
Figure 12:
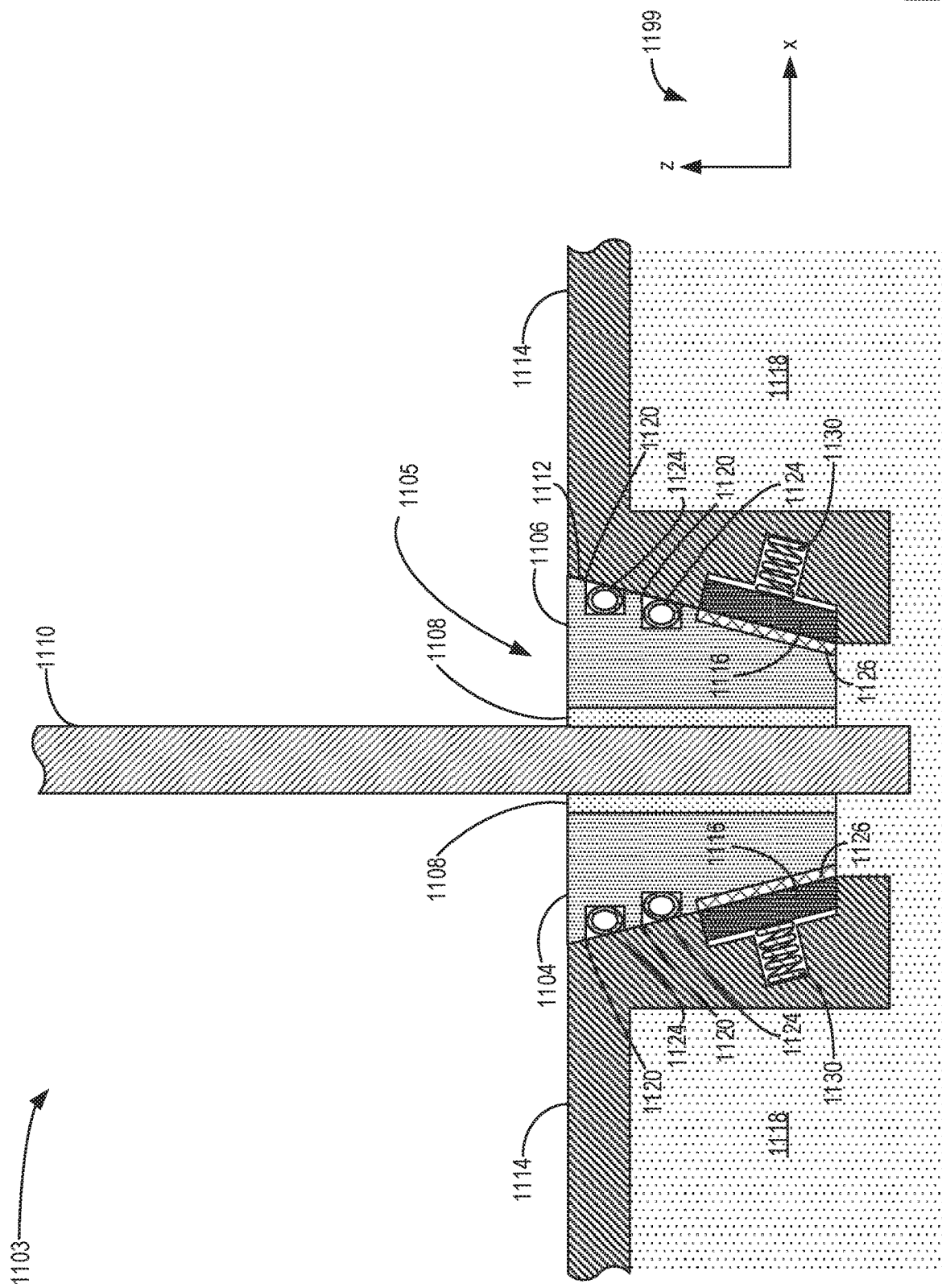
FIG. 12 shows a cross-sectional view of the tapered seal of FIG. 11 coupled to the fluid passage and coupled to the inlet opening of the vacuum chamber, according to an embodiment of the invention.

FIGS. 2-14 each show various embodiments of sealing systems including tapered seals (similar to tapered seal 26 shown in FIG. 1) that may be included by a DNP system (such as the DNP system 10 shown by FIG. 1 and described above). Specifically, FIG. 2 shows a first embodiment of a sealing system including a tapered seal, with sections of the tapered seal configured to engage with each other via a plurality of grooves and protrusions. FIGS. 3-5 show a second embodiment of a sealing system including a tapered seal, with the tapered seal shown in various coupled and decoupled positions relative to an inlet opening of a vacuum chamber and relative to a fluid passage of a DNP system. The tapered seal includes a plurality of radial biasing members configured to couple the tapered seal to the inlet opening. The radial biasing members may be compressed against surfaces of the inlet opening in order to retain a position of the tapered seal against the inlet opening. A third embodiment of a sealing system shown by FIGS. 6-8 includes a tapered seal having sections coupled together by a plurality of spring coils. The spring coils may press against surfaces of an inlet opening of a vacuum chamber in order to seal the tapered seal against the inlet opening, as shown by FIG. 8. A fourth embodiment of a sealing system shown by FIGS. 9-10 includes a tapered seal similar to that shown by FIGS. 6-8, and includes an alternate inlet opening having a plurality of ring gaskets. A fifth embodiment of a sealing system is shown by FIGS. 11-12, with an inlet opening of a vacuum chamber including a plurality of surfaces biased away from the inlet opening by biasing members. A tapered seal may press against the surfaces in order to be retained in sealing engagement with the inlet opening. FIG. 13 shows two different top views of a sixth embodiment of a sealing system, with a tapered seal of the sealing system having three sections coupleable to a fluid passage. FIG. 14 shows a seventh embodiment of a sealing system, with a tapered seal of the sealing system having three sections shaped to fit together via interlocking slots and protrusions.

Various axes are included in the figures for comparison of the different views of each embodiment. For example, reference axes 299 are shown to illustrate positioning of the various components of the first embodiment shown by FIG. 2, FIGS. 3-5 include reference axes 399 for comparison of the views of the second embodiment, FIGS. 6-8 include reference axes 699 for comparison of the views of the third embodiment, FIGS. 9-10 include reference axes 999 for comparison of the views of the fourth embodiment, FIGS. 11-12 include reference axes 1199 for comparison of the views of the fifth embodiment, FIG. 13 includes reference axes 1398 for comparison of the views of the sixth embodiment, and FIG. 14 includes reference axes 1499 for comparison of the views of the seventh embodiment.

Alternate embodiments may include components combining features included by the various different embodiments described herein. For example, a tapered seal of a sealing system may include sections configured to engage with each other via a plurality of grooves and protrusions (which may also be referred to as teeth) as described herein with reference to the embodiment shown by FIG. 2, and the sections of the tapered seal may be coupled together via a plurality of spring coils as described herein with reference to the embodiment shown by FIGS. 6-8. In another example, a tapered seal of a sealing system may include radial biasing members as described herein with reference to the embodiment shown by FIGS. 3-5, and the tapered seal may be formed in three sections as described with reference to the embodiment shown by FIG. 13 or FIG. 14. Other combinations may be possible.

Turning firstly to FIG. 2, a perspective view is shown of a sealing system 201 for a DNP system (such as the DNP system 10 shown by FIG. 1 and described above), with the sealing system 201 including a tapered seal 200. The tapered seal 200 is shaped to couple with an inlet opening 212 of a liquid helium storage reservoir 222 (e.g., similar to container 24 shown by FIG. 1 and described above) in order to fluidly seal the inlet opening 212 (e.g., to reduce a flow of fluid through the opening around exterior surfaces of the tapered seal 200). For example, the inlet opening 212 may be fluidly coupled to an interior of the storage reservoir 222, with the storage reservoir 222 containing a liquid helium bath (similar to the liquid helium bath 22 shown by FIG. 1 and described above). In some examples, the inlet opening 212 may be formed by an annular protrusion 218 extending outward from a top surface 214 of the storage reservoir 222 and away from the liquid helium bath. The tapered seal 200 may be coupled to the inlet opening 212 in order to reduce a flow of atmospheric air into the helium bath, and/or to reduce a flow of liquid and/or gaseous helium from the helium bath to locations external to the storage reservoir 222 (e.g., to atmosphere). However, the tapered seal 200 includes a central opening 232 (which may be referred to herein as a through-hole or a channel) shaped such that a fluid passage 210 (similar to outer tube 44 shown by FIG. 1 and described above) may be positioned within the central opening 232 of the tapered seal 200 in order to flow fluid (e.g., hyperpolarized solution) through the tapered seal 200 and into the storage reservoir 222 (or vice versa, e.g., to flow hyperpolarized solution through the tapered seal 200 and out of the storage reservoir 222 via the fluid passage 210). During conditions in which the fluid passage 210 is positioned within the central opening 232, the fluid passage 210 is positioned along a central axis 221 of the central opening 232 and the tapered seal 200.

The central opening 232 is formed by both of a first section 202 and a second section 204 of the tapered seal 200. Said another way, the first section 202 forms a first portion of the central opening 232, the second section 204 forms a second portion of the central opening 232, and the central opening 232 is positioned between the first section 202 and the second section 204 during conditions in which the first section 202 and second section 204 are coupled together. The first section 202 is removably coupled to the second section 204 so that a user of the tapered seal 200 (e.g., a technician, operator of the DNP system, etc.) may decouple the first section 202 and the second section 204 from each other in order to remove the tapered seal 200 from the DNP system without adjusting a position of the fluid passage 210. In one example, the first section 202 and second section 204 may be coupled together by a fastener 224 (e.g., a pin, bolt, etc.) inserted into an opening 228 (e.g., an aperture) positioned at a side surface 219 (e.g., an outer surface) of the first section 202. The opening 228 forms an open end of a passage 229 positioned within an interior of the tapered seal 200. The fastener 224 may be inserted into the opening 228 and into the passage 229 (as indicated by arrow 226) in order to retain the first section 202 in engagement (e.g., in face-sharing contact) with the second section 204. In some examples, the fastener 224 and passage 229 may each include threaded surfaces, with the threaded surfaces of the fastener 224 being shaped to engage with the threaded surfaces of the passage 229.

In some examples (as shown by inset 239), one or more surfaces of the first section 202 and/or second section 204 may be shaped retain the first section 202 and second section 204 in locking engagement during conditions in which the first section 202 and second section 204 are coupled together (e.g., via fastener 224 in one example, as described above). In the example shown by FIG. 2, the inset 239 shows an enlarged portion of the tapered seal 200. Each section (e.g., first section 202 and second section 204) includes a second plurality of inner surfaces 209 positioned adjacent to the inner surfaces 208 and adjacent to the outer surfaces (e.g., side surface 219). The inner surfaces 209 of each section form grooves and protrusions positioned to interlock with grooves and protrusions of each other section. For example, the first section 202 includes a first plurality of grooves 240 in an alternating arrangement with a first plurality of protrusions 244, and the second section 204 includes a second plurality of grooves 246 in an alternating arrangement with a second plurality of protrusions 242. During conditions in which the first section 202 and second section 204 are coupled together, the grooves 240 of the first section 202 are shaped to engage with (e.g., be in face-sharing contact with) the protrusions 242 of the second section 204, and the grooves 246 of the second section 204 are shaped to engage with the protrusions 244 of the first section 202. In this arrangement, during conditions in which the first section 202 and second section 204 are coupled together, a likelihood of motion (e.g., shifting) of the first section 202 relative to the second section 204 (or vice versa) may be reduced. In other examples, the first section 202 and/or second section 204 may include surfaces with a different shape (such as teeth in various shapes including triangular, rectangular, and/or square) and/or relative arrangement, with the surfaces of the first section 202 configured to engage the surfaces of the second section 204 and to reduce a likelihood of relative motion of the first section 202 and second section 204 as described above.

The central opening 232 of the tapered seal 200 is formed by a first plurality of inner surfaces 208 of the first section 202 and the second section 204. In one example, the inner surfaces 208 may include one or more surfaces formed from a material having a lower coefficient of friction than other (e.g., remaining) surfaces of the tapered seal 200. The surfaces with the lower coefficient of friction are sealed against the fluid passage 210 during conditions in which the first section 202 and second section 204 are coupled to each other around the fluid passage 210. The lower coefficient of friction may enable the fluid passage 210 to slide more easily within the central opening 232 of the tapered seal 200 after the tapered seal 200 has been coupled to the fluid passage 210, and the ease of sliding may enable a vial 223 (similar to vial 28 described above with reference to FIG. 1) coupled to an end 225 of the fluid passage 210 to be more easily positioned within an interior of the liquid helium storage reservoir 222 (e.g., positioned within the liquid helium bath contained by the storage reservoir 222).

In some examples, the outer surfaces of the tapered seal 200 (e.g., side surface 219) may include one or more openings 230 shaped to house biasing members. The biasing members may press against surfaces of the inlet opening 212 during conditions in which the tapered seal 200 is coupled to the fluid passage 210 and sealed against the inlet opening 212 in order to retain the tapered seal 200 in sealing engagement with the surfaces of the inlet opening 212. One example of similar biasing members that may be included by the tapered seal 200 are described below with reference to the embodiment shown by FIGS. 3-5. In some examples, the sealing system 201 may include a shim 216 shaped to couple around the outer perimeter of the fluid passage 210 and retain a position of the tapered seal 200 along the fluid passage 210. In other examples, the sealing system 201 may not include shim 216.

FIGS. 3-5 each show a second embodiment of a sealing system 301 that may be included within a DNP system (e.g., DNP system 10 shown by FIG. 1 and described above), with a tapered seal 302 of the sealing system 301 shown in various configurations. Specifically, FIG. 3 shows a first section 304 and a second section 306 of the tapered seal 302 decoupled (e.g., separated) from each other, FIG. 4 shows the first section 304 and the second section 306 of the tapered seal 302 coupled around a fluid passage 310 of the DNP system, and FIG. 5 shows the tapered seal 302 coupled to the fluid passage 310 and inserted into (e.g., sealed against) an inlet opening 312 of a liquid helium storage reservoir 314 of the DNP system. An inset 390 shows a top view of the tapered seal 302.

The first section 304 and second section 306 each include a plurality of radial biasing members 320 positioned partly within an interior of each section and extending outward from outer surfaces 307 (which may be referred to herein as side surfaces, similar to side surface 219 described above) of each section. The radial biasing members 320 extend in a radial direction relative to a central axis 317 of the tapered seal 302 (e.g., as additionally shown by FIG. 4, with FIG. 4 showing the first section 304 and second section 306 coupled together around the fluid passage 310). Each radial biasing member 320 may be angled downward in a direction of a bottom side 309 of the tapered seal 302, with the bottom side 309 being opposite to a top side 311. During conditions in which the tapered seal 302 is coupled with the inlet opening 312 (as shown by FIG. 5), the bottom side 309 is positioned closer to an interior 318 of the storage reservoir 314 than the top side 311.

During conditions in which the tapered seal 302 is coupled with the inlet opening 312 in order to seal the inlet opening 312, the radial biasing members 320 press the tapered seal 302 against surfaces of the inlet opening 312 in order to retain the position of the tapered seal 302 within the inlet opening 312. In some examples, the inlet opening 312 may include one or more surfaces formed of a material with a higher coefficient of friction (e.g., rubber) relative to other surfaces of the inlet opening 312. In the embodiment shown by FIGS. 3-5, each radial biasing member 320 includes a ball 324 coupled to an end of a spring 322 such that the ball 324 protrudes outward from the outer surfaces 307 of the tapered seal 302. In this configuration, inserting the tapered seal 302 into the inlet opening 312 compresses the spring 322 and moves the ball 324 in an inward direction relative to the central axis 317, thereby biasing the ball 324 against the surfaces of the inlet opening 312. With the tapered seal 302 inserted into the inlet opening 312, the biasing force of the spring 322 is in an outward direction relative to the outer surfaces of the tapered seal 302 (e.g., a direction toward the surfaces of the inlet opening 312). The biasing force of the spring 322 presses the ball 324 against the surfaces of the inlet opening 312 and retains the tapered seal 302 against the inlet opening 312 (e.g., in sealing engagement with the inlet opening). In alternate embodiments, the radial biasing members 320 may be a different type of biasing member.

A through-hole 313 is formed by a first plurality of inner surfaces 308 of both of the first section 304 and second section 306 (similar to central opening 232 and inner surfaces 208 described above with reference to FIG. 2), and the fluid passage 310 is positioned within the through-hole 313 during conditions in which the tapered seal 302 and fluid passage 310 are coupled together (as shown by FIGS. 4-5). The first section 304 and second section 306 of the tapered seal 302 may be coupled together around the fluid passage 310 in order to seal against an outer perimeter of the fluid passage 310 without inserting an end 315 of the fluid passage 310 into the through-hole 313 through the bottom side 309 or top side 311. Said another way, the fluid passage 310 and tapered seal 302 may be coupled together without moving the fluid passage 310 relative to the first section 304 and second section 306 so that the end 315 of the fluid passage 310 does not come into face-sharing contact with surfaces of the first section 304 and/or second section 306. By coupling the tapered seal 302 to the fluid passage 310 in this way, the tapered seal 302 is coupled to the fluid passage 310 with a reduced likelihood of contamination (e.g., de-sterilization) of the sealing system 301 (due to a transfer of contaminating materials from the tapered seal 302 to an interior of the fluid passage 310, for example).

As shown by FIG. 3, the first section 304 and the second section 306 each include a plurality of openings (e.g., opening 354, opening 356, opening 358, and opening 360) formed by the outer surfaces 307 and extending through an interior of each section. Specifically, the first section 304 includes opening 354 and opening 356 extending in a direction perpendicular to the through-hole 313 and central axis 317. The opening 354 and the opening 356 each extend through the first section 304 from the outer surfaces 307 to a second plurality of inner surfaces 331 positioned adjacent to the through-hole 313 (e.g., similar to inner surfaces 209 described above with reference to FIG. 2). The opening 354 and the opening 356 are shown to extend parallel to each other. The opening 354 and the opening 356 of the first section 304 are positioned to align with the opening 358 and the opening 360 (respectively) of the second section 306 during conditions in which the first section 304 and second section 306 are positioned in face-sharing contact with each other around the fluid passage 310 as described above (and as shown by FIGS. 5-6). In this configuration, fasteners may be inserted through the openings in order to couple (e.g., fasten) the first section 304 and the second section 306 together. For example, as shown by FIG. 4, a first fastener 350 may be inserted into both of the opening 354 of the first section 304 and the opening 358 of the second section 306. Similarly, a second fastener 352 may be inserted into both of the opening 356 of the first section 304 and the opening 360 of the second section 306. In one example, the first fastener 350 and second fastener 352 may be pins, bolts, etc. In another example, the openings may be threaded openings and the fasteners may be threaded fasteners, with the threads of the openings shaped to engage with the threads of the fasteners.

In alternate embodiments, one or more of the openings of the first section 304 and/or second section 306 may be angled relative to one or more of the other openings. In some embodiments, one or more of the openings may not extend through an entire interior of the corresponding section from which it is formed (e.g., first section 304 or second section 306).

In some examples, the inlet opening 312 of the storage reservoir 314 may include one or more surfaces 316 formed of a material having a relatively higher coefficient of friction than other surfaces of the inlet opening 312. For example, the surfaces 316 may be formed from rubber and may be positioned to be in face-sharing contact with the outer surfaces 307 of the tapered seal 302 during conditions in which the tapered seal 302 is sealed against the inlet opening 312 (as shown by FIG. 5). The increased friction between the surfaces 316 of the inlet opening 312 and the outer surfaces 307 of the tapered seal 302 may further retain the tapered seal 302 within the inlet opening 312.

As shown by FIG. 4, the tapered seal 302 is tapered such that a diameter 400 of the top side 311 (further illustrated by inset 490) is greater than a diameter 402 of the bottom side 309. The surfaces of the inlet opening 312 may be similarly tapered such that a diameter 404 of the inlet opening 312 at a side further from the liquid helium bath is greater than a diameter 406 of the inlet opening 312 at a side closer to the helium bath. Said another way, the inlet opening 312 is tapered similarly to the tapered seal 302 such that the shape of the inlet opening 312 forms a counterpart to the tapered seal 302, and the tapered seal 302 may fit within the inlet opening 312 to seal against the inlet opening 312 (as shown by FIG. 5).

FIGS. 6-8 each show a third embodiment of a sealing system 601 that may be included within a DNP system (e.g., DNP system 10 shown by FIG. 1 and described above), with a tapered seal 602 of the sealing system 601 shown in various configurations. Specifically, FIG. 6 shows a first section 604 and a second section 606 of the tapered seal 602 decoupled (e.g., separated) from each other, FIG. 7 shows the first section 604 and the second section 606 of the tapered seal 602 coupled around a fluid passage 610 of the DNP system, and FIG. 8 shows the tapered seal 602 coupled to the fluid passage 610 and inserted into (e.g., sealed against) an inlet opening 612 fluidly coupled to an interior 618 of a liquid helium storage reservoir 614 of the DNP system.

The first section 604 and the second section 606 each include a plurality of grooves 620 shaped to receive (e.g., to couple with) a plurality of coil springs 624. As shown by inset 690, each coil spring 624 may be an annular spring having an inner diameter 626 approximately a same amount of length as a diameter 726 (shown by FIG. 7) of the grooves 620 in a radial direction relative to a central axis 613 of the tapered seal 602 during conditions in which inner surfaces 608 (similar to inner surfaces 208 shown by FIG. 2 and inner surfaces 308 shown by FIG. 3, described above) of the first section 604 and the second section 606 are sealed against an outer perimeter of the fluid passage 610. The coil springs 624 couple within the grooves 620 to encircle an outer perimeter of the tapered seal 602 and to retain the first section 604 in engagement with the second section 606.

In some examples, such as the example shown by inset 691, each coiled spring 624 may be a linear (e.g., straight) spring having a first end 680 shaped to fit within a second end 681. By fitting the first end 680 into the second end 681, the coiled spring 624 is curved into the annular shape shown by inset 690 so that the coiled spring 624 may encircle the outer perimeter of the tapered seal 602. In other examples, such as the example shown by inset 692, each coil spring 624 may include a first end 682 and a second end 683 shaped to receive an inserted segment 684. The inserted segment 684 may be press-fit into each of the first end 682 and second end 683 in order to curve the coil spring 624 into the annular shape and couple the first end 682 and second end 683 together. In other examples, such as the example shown by inset 693, each coil spring 624 may include a first end 685 having a first looped hook 687 and a second end 686 having a second looped hook 688. The first looped hook 687 and second looped hook 688 may be shaped to couple with each other in order to curve the coil spring 624 into the annular shape. In yet other examples, the ends of one or more of the coil springs 624 may be shaped in a different way relative to each other coil spring.

During conditions in which the tapered seal 602 is sealed against the inlet opening 612, the coil springs 624 are positioned to press against surfaces of the inlet opening 612 in order to retain the tapered seal 602 in sealing engagement with the inlet opening 612. For example, each coil spring 624 may be compressed by the surfaces of the inlet opening 612 as the tapered seal 602 is inserted into the inlet opening 612, and the compression of the coil springs 624 results in a biasing force of the coil springs 624 against the surfaces of the inlet opening 612. The biasing force may retain the tapered seal 602 in sealing engagement with the inlet opening 612.

FIGS. 9-10 each show a fourth embodiment of a sealing system 907 that may be included within a DNP system (e.g., DNP system 10 shown by FIG. 1 and described above), with a tapered seal 902 of the sealing system 907 shown in various configurations. Specifically, FIG. 9 shows inner surfaces 908 (similar to inner surfaces 208 shown by FIG. 2, inner surfaces 308 shown by FIGS. 3-5, and inner surfaces 608 shown by FIGS. 6-8, described above) of a first section 904 and a second section 906 of the tapered seal 902 coupled around (e.g., sealed against) a fluid passage 910 of the DNP system, and FIG. 10 shows the tapered seal 902 coupled to the fluid passage 910 and inserted into (e.g., sealed against) an inlet opening 912 fluidly coupled to an interior 918 of a liquid helium storage reservoir 914 of the DNP system.

The tapered seal 902 shown by FIGS. 9-10 includes a plurality of grooves 920 shaped to couple with a plurality of coiled springs 924, similar to the grooves 620 and coil springs 624 described above with reference to FIGS. 6-8. The coiled springs 924 may be coupled to the grooves 920 in order to couple the first section 904 and the second section 906 to each other around an outer perimeter of the fluid passage 910. The coiled springs 924 may additionally retain the tapered seal 902 in sealing engagement with the inlet opening 912 (similar to the example described above with reference to FIGS. 6-8).

The inlet opening 912 shown by FIGS. 9-10 includes a plurality of slots 919 shaped to receive (e.g., couple with) a plurality of gasket rings 916. In one example, the gasket rings 916 may be formed of a material (e.g., rubber) having a higher coefficient of friction relative to surfaces of the inlet opening 912. During conditions in which the tapered seal 902 is sealed against the inlet opening 912 (as shown by FIG. 10), the gasket rings 916 are compressed within the slots 919 in order to increase an amount of friction between the tapered seal 902 and the inlet opening 912. In this configuration, the tapered seal 902 may be retained in sealing engagement with the inlet opening 912 by the gasket rings 916 and the coiled springs 924.

FIGS. 11-12 each show a fifth embodiment of a sealing system 1103 that may be included within a DNP system (e.g., DNP system 10 shown by FIG. 1 and described above), with a tapered seal 1105 of the sealing system 1103 shown in various configurations. Specifically, FIG. 11 shows inner surfaces 1108 (similar to inner surfaces 208 shown by FIG. 2, inner surfaces 308 shown by FIGS. 3-5, inner surfaces 608 shown by FIGS. 6-8, and inner surfaces 908 shown by FIGS. 9-10, described above) of the first section 1104 and the second section 1106 of the tapered seal 1105 coupled around (e.g., sealed against) a fluid passage 1110 of the DNP system, and FIG. 12 shows the tapered seal 1105 coupled to the fluid passage 1110 and inserted into (e.g., sealed against) an inlet opening 1112 of a liquid helium storage reservoir 1114 of the DNP system.

The tapered seal 1105 shown by FIGS. 11-12 includes a plurality of grooves 1120 shaped to couple with a plurality of coiled springs 1124, similar to the grooves 620 and coil springs 624 described above with reference to FIGS. 6-8, and similar to the grooves 920 and coiled springs 924 described above with reference to FIGS. 9-10. The coiled springs 1124 may be coupled to the grooves 1120 in order to couple the first section 1104 and the second section 1106 to each other around an outer perimeter of the fluid passage 1110. The coiled springs 1124 may additionally retain the tapered seal 1105 in sealing engagement with the inlet opening 1112 (similar to the example described above with reference to FIGS. 6-8, and the example described above with reference to FIGS. 9-10).

The first section 1104 and the second section 1106 of the tapered seal 1105 may each include outer surfaces 1126 formed of a material (e.g., rubber) having a higher coefficient of friction than other outer surfaces of the tapered seal 1105. During conditions in which the tapered seal 1105 is sealed against the inlet opening 1112 (as shown by FIG. 12), the outer surfaces 1126 are positioned in face-sharing contact with surfaces of the inlet opening 1112 in order to increase an amount of friction between the tapered seal 1105 and the inlet opening 1112.

The inlet opening 1112 may additionally include one or more protrusions 1116 housed within recesses 1128 of the inlet opening 1112. Each protrusion 1116 is biased in a direction of the tapered seal 1105 (e.g., a direction away from surfaces of the inlet opening 1112 and away from an interior 1118 of the storage reservoir 1114) by a biasing member 1130 during conditions in which the tapered seal 1105 is sealed against the inlet opening 1112. For example, during conditions in which the tapered seal 1105 is not coupled with the inlet opening 1112, the protrusions 1116 may extend outward from the surfaces of the inlet opening 1112 due to the biasing of the protrusions 1116 by the biasing members 1130. As the tapered seal 1105 is inserted into the inlet opening 1112, the biasing members 1130 are compressed by the tapered seal 1105 and the protrusions 1116 move inward into the recesses 1128. A restoring force of the biasing members 1130 presses the protrusions 1116 outward against the tapered seal 1105 and retains the protrusions 1116 in face-sharing contact with the tapered seal 1105 in order to retain the tapered seal 1105 in sealing engagement with the inlet opening 1112. In some examples, the protrusions 1116 may be pressed against the outer surfaces 1126 in order to further increase an amount of friction between the tapered seal 1105 and the inlet opening 1112.

FIG. 13 shows a sixth embodiment of a sealing system 1349 that may be included within a DNP system (e.g., DNP system 10 shown by FIG. 1 and described above). Specifically, first inset 1300 shows a first section 1312, a second section 1314, and a third section 1316 of a tapered seal 1350 of the sealing system 1349 decoupled (e.g., separated) from each other, and second inset 1302 shows inner surfaces 1308 (similar to inner surfaces 208 shown by FIG. 2, inner surfaces 308 shown by FIGS. 3-5, inner surfaces 608 shown by FIGS. 6-8, inner surfaces 908 shown by FIGS. 9-10, and inner surfaces 1108 shown by FIGS. 11-12, described above) of the first section 1312, second section 1314, and third section 1316 sealed against an outer perimeter of a fluid passage 1304 of the DNP system.

In the example shown by FIG. 13, each of the first section 1312, second section 1314, and third section 1316 are positioned in a symmetrical arrangement relative to each other during conditions in which the tapered seal 1350 is sealed around an outer perimeter of the fluid passage 1304. An outer perimeter of each of the first section 1312, second section 1314, and third section 1316 has a length 1313. However, in alternate embodiments, one or more of the sections may be shaped differently relative to each other section. For example, the outer perimeter of the first section may have a length less than the length 1313, and the outer perimeter of the second section and/or third section may have a length greater than the length 1313. In yet other embodiments, the tapered seal may include more than three sections (e.g., four, five, etc.). In each embodiment including three or more sections, the sections may be coupled together via coil springs (as described above with reference to FIGS. 6-8, FIGS. 9-10, and FIGS. 11-12), fasteners (e.g., similar to fasteners 350 and 352 described above with reference to FIGS. 3-5), a combination of coil springs and fasteners, or a different type of fastening element (e.g., clamps, etc.).

FIG. 14 shows a seventh embodiment of a sealing system 1453 that may be included within a DNP system (e.g., DNP system 10 shown by FIG. 1 and described above). Specifically, first inset 1400 shows a first section 1418, a second section 1420, and a third section 1422 of a tapered seal 1452 of the sealing system 1453 decoupled (e.g., separated) from each other, and second inset 1402 shows a first plurality of inner surfaces 1410 (similar to inner surfaces 208 shown by FIG. 2, inner surfaces 308 shown by FIGS. 3-5, inner surfaces 608 shown by FIGS. 6-8, inner surfaces 908 shown by FIGS. 9-10, inner surfaces 1108 shown by FIGS. 11-12, and inner surfaces 1308 shown by FIG. 13, described above) of the first section 1418, second section 1420, and third section 1422 sealed against an outer perimeter of a fluid passage 1406 of the DNP system.

Each section (e.g., first section 1418, second section 1420, and third section 1422) of the tapered seal 1452 includes a plurality of tangential slots and tangential protrusions formed by a second plurality of inner surfaces 1411 positioned adjacent to the inner surfaces 1410 and shaped to couple (e.g., interlock) with tangential slots and tangential protrusions of each adjacent section during conditions in which the tapered seal 1452 is sealed against an outer perimeter of the fluid passage 1406. For example, the first section 1418 is shown to include a first tangential protrusion 1454 and a first tangential slot 1450, and the second section 1420 includes a second tangential protrusion 1451 and a second tangential slot 1456. The first tangential protrusion 1454 of the first section 1418 is shaped to couple (e.g., interlock) with the second tangential slot 1456 of the second section 1420, and the first tangential slot 1450 of the first section 1418 is shaped to couple with the second tangential protrusion 1451 of the second section 1420.

The adjacent tangential slots and tangential protrusions of each section are angled relative to each other by an angle 1460. For example, a first axis 1462 is positioned along the first tangential slot 1450 and a second axis 1464 is positioned along the first tangential protrusion 1454, with each of the first axis 1462 and the second axis 1464 extending in a radial direction relative to a central axis 1465 (similar to central axis 221 shown by FIG. 2, central axis 317 shown by FIG. 3, etc.) of the tapered seal 1452. The first axis 1462 and second axis 1464 are angled relative to each other by the angle 1460 in a plane formed by x-axis and y-axis of reference axes 1499. In alternate embodiments, the angle 1460 between adjacent tangential slots and tangential protrusions of one or more sections may be a different amount of angle, and/or a length of one or more tangential slots and/or tangential sections in a radial direction relative to the central axis 1465 may be different.

FIG. 15 shows a method for operating DNP system including a sealing system having a tapered seal. In one example, the DNP system described herein with reference to method 1500 may be similar to the DNP system 10 shown by FIG. 1 and described above. In some examples, the sealing system and tapered seal described with reference to method 1500 shown by FIG. 15 may be similar to the sealing system 71 and tapered seal 26 shown by FIG. 1, sealing system 201 and tapered seal 200 shown by FIG. 2, sealing system 301 and tapered seal 302 shown by FIGS. 3-5, sealing system 601 and tapered seal 602 shown by FIGS. 6-8, sealing system 907 and tapered seal 902 shown by FIGS. 9-10, sealing system 1103 and tapered seal 1105 shown by FIGS. 11-12, sealing system 1349 and tapered seal 1350 shown by FIG. 13, and/or sealing system 1453 and tapered seal 1452 shown by FIG. 14.

At 1502 the method includes filling a vial with contrast agents, welding the vial directly to an outer fluid passage, and positioning the vial within a liquid helium storage reservoir. In some examples, the vial may be similar to the vial 28 described above with reference to FIG. 1. The outer fluid passage may be similar to the outer tube 44 shown by FIG. 1, fluid passage 210 shown by FIG. 2, fluid passage 310 shown by FIGS. 3-5, fluid passage 610 shown by FIGS. 6-8, fluid passage 910 shown by FIGS. 9-10, fluid passage 1110 shown by FIGS. 11-12, fluid passage 1304 shown by FIG. 13, and/or fluid passage 1406 shown by FIG. 14 and described above. The liquid helium storage reservoir may be similar to the container 24 shown by FIG. 1, storage reservoir 222 shown by FIG. 2, storage reservoir 314 shown by FIGS. 3-5, storage reservoir 614 shown by FIGS. 6-8, storage reservoir 914 shown by FIGS. 9-10, and/or storage reservoir 1114 shown by FIGS. 11-12.

Filling the vial with contrast agents may include positioning imaging contrast agents for use with magnetic resonance imaging (MM) and/or nuclear magnetic resonance (NMR) spectroscopy within an interior of the vial. In one example, the contrast agents may be a mixture of 13C1-pyruvic acid and electron paramagnetic agent (EPA). In other examples, a different type of contrast agent may be used. Welding the vial directly to the outer fluid passage may include permanently coupling (e.g., fusing, gluing, etc.) a main opening of the vial with an end of the outer fluid passage in order to fluidly couple the interior of the vial with an interior of the outer fluid passage. Positioning the vial within the liquid helium storage reservoir may include inserting the vial through an inlet opening of the liquid helium storage reservoir in order to submerge the vial in a bath of liquid helium (e.g., liquid helium bath 22 described above with reference to FIG. 1) contained within the storage reservoir. In some examples, the inlet opening may be similar to the inlet openings 51, 212, 312, 612, 912, and/or 1112 shown by FIG. 1, FIG. 2, FIGS. 3-5, FIGS. 6-8, FIGS. 9-10, and FIGS. 11-12, respectively, and described above. Positioning the vial within the liquid helium storage reservoir (e.g., within the bath of liquid helium contained within the storage reservoir) may reduce a temperature of the vial and the contrast agents in order to prepare the contrast agents for hyperpolarization via the DNP system.

The method continues to 1504 where the method includes coupling different sections of a tapered seal to one another and around an outer perimeter of the outer fluid passage to seal inner surfaces of the different sections against the outer perimeter of the outer fluid passage. For example, the tapered seal may be similar to the embodiments described above with reference to FIG. 2, FIGS. 3-5, FIGS. 6-8, FIGS. 9-10, FIGS. 11-12, FIG. 13, or FIG. 14. In one example (similar to the embodiment shown by FIGS. 3-5 and described above), the tapered seal may include a first section and a second section coupled together via one or more fasteners (e.g., first fastener 350) inserted through one or more openings (e.g., opening 356 and opening 360) of the tapered seal. In another example, the tapered seal may include a first section and a second section coupled together via one or more coil springs positioned to encircle outer surfaces of the tapered seal (e.g., first section 604 and second section 606 coupled together via coil springs 624 as described above with reference to FIGS. 6-8, or similar to the embodiment shown by FIGS. 9-10 or the embodiment shown by FIGS. 11-12). In some examples, the first section and second section may include a plurality of grooves and protrusions similar to those shown by inset 239 and described above with reference to FIG. 2, with the protrusions of the first section shaped to interlock with the grooves of the second section, and the protrusions of the second section shaped to interlock with the grooves of the first section.

In other examples, the tapered seal may include three or more sections (e.g., similar to the embodiment shown by FIG. 13 or the embodiment shown by FIG. 14 and described above). Each section of the tapered seal is coupled to each adjacent section to encircle the outer perimeter of the outer fluid passage and seal the tapered seal against the outer fluid passage. In one example, sealing the tapered seal against the outer fluid passage includes pressing the sections of the tapered seal against outer surfaces (e.g., the outer perimeter) of the outer fluid passage (e.g., via the fasteners, coil springs, etc.) in order to reduce a flow of fluid (e.g., air) at an interface between the sections of the tapered seal and the outer surfaces of the outer fluid passage (e.g., across the outer surfaces of the outer fluid passage at the tapered seal).

In some examples, such as the examples shown by FIGS. 16A-19 and described below, a first section of the tapered seal and a second section of the tapered seal may be coupled to one another around the outer perimeter of the outer fluid passage, with first inner surfaces of the first section and second section sealing against the outer tube, and with the first inner surfaces having a toothed structure including a series of alternating peaks and valleys.

For example, the first inner surfaces of the first section may include a plurality of teeth shaped to mate (e.g., mesh, engage, etc.) with a complementary plurality of teeth of the second section. The teeth (which may be referred to herein as alternating teeth) may be positioned at a first end of the first section, and may be shaped to mate with complementary teeth (which may be referred to herein as complementary alternating teeth) at a first end of the second section. Similarly, teeth positioned at a second end of the first section may be shaped to mate with complementary teeth positioned at a second end of the second section. In this example, the first inner surfaces of the first section are annular surfaces positioned between the first and second ends of the first section, and the first inner surfaces of the second section are annular surfaces positioned between the first and second ends of the second section. The first section and second section couple to each other around the outer fluid passage such that the teeth of each section engage with each other and the first inner surfaces of each section (e.g., surfaces positioned adjacent to the teeth and recessed relative to the teeth) are pressed into face-sharing contact with the outer perimeter of the outer fluid passage.

One or more detents formed by outer surfaces of each section may be shaped to receive (e.g., couple with) one or more o-rings in order to retain the teeth of the first section in face-sharing contact with the complementary teeth of the second section. In some examples, the o-rings may be formed of a flexible material such as rubber. In other examples, the o-rings may include a plurality of coils, similar to the coil springs 624 described above.

The method continues to 1506 where the method includes sealing the tapered seal against an inlet opening of the liquid helium storage reservoir. In one example, the inlet opening may be similar to the inlet openings described above with reference to the embodiments shown by FIG. 2, FIGS. 3-5, FIGS. 6-8, FIGS. 9-10, or FIGS. 11-12. In one example, sealing the tapered seal against the inlet opening may include coupling the tapered seal to the inlet opening by pressing one or more radial biasing members of the tapered seal against surfaces of the inlet opening (as described above with reference to FIGS. 3-5), and/or by pressing one or more coil springs coupled to the tapered seal against surfaces of the inlet opening (as described above with reference to FIGS. 6-8, FIGS. 9-10, or FIGS. 11-12). In some examples, the tapered seal may include one or more surfaces formed of a material with a higher coefficient of friction (e.g., rubber), similar to outer surfaces 1126 of the tapered seal 1105 shown by FIG. 11, and the surfaces may press against surfaces of the inlet opening (e.g., counterpart surfaces) in order to seal the tapered seal against the inlet opening. In other examples, the inlet opening may include one or more surfaces formed of a material with a higher coefficient of friction (e.g., higher relative to other surfaces of the inlet opening), such as the surfaces 316 of inlet opening 312 shown by FIGS. 3-5, surfaces 616 of inlet opening 612 shown by FIG. 6-8, gasket rings 916 coupled to inlet opening 912 shown by FIGS. 9-10, or protrusions 1116 coupled to inlet opening 1112 shown by FIGS. 11-12 and described above, and the surfaces of the inlet opening may press against surfaces of the tapered seal in order to seal the tapered seal against the inlet opening (e.g., retain the surfaces of the tapered seal in face-sharing contact with surfaces of the inlet opening).

Sealing the tapered seal against the inlet opening reduces a flow of fluid (e.g., air) across outer surfaces (e.g., side surface 219 shown by FIG. 2) of the tapered seal and into (or out of) the liquid helium storage reservoir. In one example, an interior of the liquid helium storage reservoir may be voided of air (e.g., by a vacuum pump), and during conditions in which the tapered seal is coupled to the inlet opening, the surfaces of the tapered seal and the inlet opening are retained in face-sharing contact with each other in order to reduce a flow of atmospheric air into the interior of the storage reservoir around the outer surfaces of the tapered seal. In this way, the interior of the liquid helium storage reservoir may be maintained at a lower pressure than atmospheric air pressure by the tapered seal and inlet opening.

The method at 1506 optionally includes 1507, wherein the method includes applying a vacuum to a vacuum channel arranged in one of the different sections of the tapered seal in order to flow substances out of an interior chamber of the tapered seal. For example, as described below with reference to FIGS. 16A-19, the tapered seal may include one or more vacuum channels extending from an outer surface of one of the different sections to inner surfaces of the section, coupling the interior chamber of the tapered seal to a vacuum source (e.g., a vacuum pump). Substances (e.g., fluids such as air, dust particles, etc.) positioned within the interior chamber of the tapered seal may flow out of the interior chamber to a location external to the tapered seal (e.g., to a compartment within vacuum chamber 16). By flowing the substances out of the interior of the tapered seal via the vacuum channels, a sealing quality (e.g., sealing force) of the tapered seal against the outer surfaces of the outer fluid passage may be increased. For example, flowing the substances out of the interior chamber reduces a pressure within the interior chamber relative to atmospheric air pressure. The pressure differential results in the sections of the tapered seal being pressed into engagement with each other and against the outer surfaces of the outer fluid passage by the atmospheric air pressure. Additionally, by flowing the substances out of the interior chamber of the tapered seal, a likelihood of contamination of the components of the DNP system (e.g., an interior of the outer fluid passage, the vial, etc.) by the substances may be decreased.

The method continues to 1508 where the method includes hyperpolarizing the contrast agents within the vial positioned inside the liquid helium storage reservoir. For example, hyperpolarizing the contrast agents may include energizing one or more magnets of the DNP system in order to provide a magnetic field at the location of the contrast agents (e.g., at the vial positioned within the liquid helium storage container). Additionally, a microwave radiation source of the DNP system (e.g., a magnetron) may be energized in order to deliver microwave radiation at an appropriate frequency from the microwave radiation source to the contrast agents (e.g., an appropriate frequency for increasing a polarization of the nuclear spins of the contrast agents). By providing the magnetic field (via the one or more magnets) and the microwave radiation (via the microwave radiation source) to the contrast agents, the contrast agents are hyperpolarized by the DNP system.

The method continues to 1510 where the method includes flowing dissolution medium from a pressure vessel, through an inner tube positioned within the outer tube, through the tapered seal, and into the vial. For example, as shown by FIG. 2, dissolution medium may flow from the pressure vessel 32, through the inner tube 36 positioned within the outer tube 44, through the tapered seal 26, and into the vial 28. The dissolution medium and mix and/or converge with the hyperpolarized contrast agents positioned within the vial in order to form a mixture of contrast agents and dissolution medium. In some examples, an additional processing agent (e.g., processing agent 68, which may be a gadolinium solution) may also flow from an optional vessel (e.g., optional vessel 66) through the inner tube, through the tapered seal, and into the vial via actuation (e.g., opening) a valve (e.g., valve 40) coupled to the inner tube. For example, the valve may be a three-way valve with a first inlet fluidly coupled to the pressure vessel, a second inlet fluidly coupled to the optional vessel, and an outlet fluidly coupled to the vial. The three-way valve may be moved from a first position in which the valve is closed to the pressure vessel and optional vessel and opened to the vial to a second position in which the three-way valve is closed to the optional vessel and opened to the pressure vessel and the vial. Alternately, the valve may be moved from the first position to a third position in which the valve is opened (e.g., fully opened or in a positioned between fully opened and fully closed) to each of the pressure vessel, the optional vessel, and the vial. In some examples, the valve may be opened and/or closed by an operator (e.g., user) of the DNP system. In other examples, the valve may be opened and/or closed in response to signals (e.g., electrical signals) transmitted to the valve by an electronic controller of the DNP system (e.g., a computer).

While the dissolution medium and/or additional processing agent flows through the tapered seal and into the vial, the tapered seal is maintained in sealing engagement with the outer perimeter of the outer tube and the surfaces of the inlet opening of the liquid helium storage reservoir. In this way, dissolution medium and/or additional processing agent may flow within the inner tube through a central opening (e.g., central opening 232) of the tapered seal, and the tapered seal may reduce a flow of air into the liquid helium storage reservoir (as described above).

The method continues to 1512 where the method includes flowing a mixture of contrast agents and dissolution medium from the vial, through the outer tube, through the tapered seal, and to a collection reservoir. For example, flowing the mixture of contrast agents and dissolution medium from the vial may include overfilling the vial via the flow of dissolution medium from the pressure vessel so that the overflowing mixture flows into the outer tube coupled to the vial. As the mixture flows into the outer tube from the vial, the mixture flows within the outer tube through the central opening of the tapered seal while the tapered seal is maintained in sealing engagement with the outer perimeter of the outer tube and the surfaces of the inlet opening of the liquid helium storage reservoir. The mixture then flows through the tube to a collection reservoir (e.g., receiving vessel 55) of the DNP system for collection by an operator of the DNP system (e.g., for injection of the mixture into a patient). In some examples, as the mixture flows through the outer tube to the collection reservoir, the mixture may flow through one or more filters (e.g., filter cartridge 54 and/or filter 59), heat exchangers (e.g., heat exchanger 57), and/or other components (e.g., holding container 48) of the DNP system.

FIGS. 16A-16B each show perspective views of a first section 1600 of a tapered seal (e.g., tapered seal 200 shown by FIG. 2 and described above). Specifically, FIG. 16A shows the first section 1600 in a first perspective view with inner surfaces 1614 forming an interior chamber 1602 being shown, and FIG. 16B shows the first section 1600 in the first perspective view with a fluid passage 1622 (e.g., similar to the outer tube 44) positioned against the inner surfaces 1614 and within the inner chamber 1602. Reference axes 1699 are included by each of FIGS. 16A-16B for comparison of the views shown.

The first section 1600 of the tapered seal includes a plurality of alternating teeth 1604 formed at a first end 1606 and a second end 1608 of the first section 1600. The teeth 1604 are formed from a first plurality of inner surfaces of the first section 1600, such as inner surface 1610 and inner surface 1612. Each surface of the first plurality of inner surfaces is positioned at an angle relative to each adjacent surface of the first plurality of inner surfaces. For example, the inner surface 1610 extends at an angle relative to the inner surface 1612 such that the inner surface 1610 and inner surface 1612 together form a tooth (e.g., a peak) of the plurality of teeth 1604. In some examples, teeth positioned at the first end 1606 of the first section 1600 may be in an opposing configuration relative to teeth positioned at the second end 1608. For example, as indicated by axis 1603 extending in a radial direction of the tapered seal (e.g., radially relative to a central axis 1605 of the tapered seal), peaks positioned at the first end 1606 (such as the peak formed by inner surface 1610 and inner surface 1612) may be radially aligned with corresponding valleys (e.g., a valley formed by inner surface 1607 and inner surface 1609) positioned at the second end 1608. Similarly, valleys positioned at the first end 1606 may be radially aligned with peaks positioned at the second end 1608.

The first section 1600 includes a plurality of openings (e.g., apertures) formed by the inner surfaces 1614 at the interior chamber 1602. Each opening (e.g., first opening 1616 and second opening 1618) extends through the first section 1600 to an outer surface 1620 of the first section 1600, forming a plurality of vacuum channels within an interior of the first section 1600. In some examples (such as the examples shown by FIGS. 17-19 and described below), the vacuum channels may be coupled to a vacuum source (e.g., a vacuum pump, vacuum chamber, etc.) in order to flow substances out of the interior chamber 1602 and to increase a sealing quality of the tapered seal against the fluid passage 1622 (as described above with reference to step 1507 of FIG. 15).

FIGS. 17-19 show a tapered seal 1731 having a first section 1700 and a second section 1701, with each section each including a plurality of toothed surfaces similar to the example described above with reference to FIGS. 16A-16B. Specifically, FIG. 17 shows a side view of the first section 1700 of the tapered seal 1731 with a fluid passage 1702 positioned against a plurality of inner surfaces 1711 of the first section 1700, FIGS. 18A-18C show side views of the first section 1700 and second section 1701 coupled and decoupled from the fluid passage 1702, and FIG. 19 shows the tapered seal 1731 coupled to an inlet 1906 of a liquid helium storage reservoir 1900. Reference axes 1799 are included by each of FIGS. 17-19 for comparison of the views shown.

As shown by FIG. 17, the first section 1700 includes inner surfaces 1711 shaped to seal, via multiple points of contact, against fluid passage 1702 (e.g., while the fluid passage 1702 slides within an interior chamber 1712, which may be referred to herein as a channel, formed by the inner surfaces 1711). During conditions in which the tapered seal 1731 is coupled around the fluid passage 1702, the fluid passage 1702 is positioned along a central axis 1704 of the tapered seal 1731. In the example shown by FIGS. 17-19, the inner surfaces 1711 are annular toothed surfaces extending in a direction around the central axis 1704 such that the inner surfaces 1711 surround an outer perimeter of the fluid passage 1702 during conditions in which the fluid passage 1702 is coupled to the tapered seal 1731. The second section includes a similar plurality of annular toothed surfaces 1751, as shown by FIGS. 18A-18C.

The first section 1700 additionally includes a second plurality of inner surfaces (e.g., inner surface 1706 and inner surface 1708) forming a plurality of teeth 1730 (shown by FIGS. 18A-18C) similar to the teeth 1604 described above with reference to FIGS. 16A-16B. The teeth 1730 of the first section 1700 are shaped to engage with a plurality of counterpart teeth 1732 of the second section 1701, as shown by FIGS. 18B-18C. During conditions in which the teeth 1730 and the counterpart teeth 1731 are engaged with each other around the fluid passage 1702, one or more o-rings 1711 may be coupled to one or more detents 1710 around outer surfaces of the first section 1700 and second section 1701 in order to further couple the tapered seal 1731 around the fluid passage 1702.

Additionally, the first section 1700 includes a plurality of openings (e.g., apertures) formed by the inner surfaces 1711 and coupled to vacuum channels extending through an interior of the first section 1700. For example, the first section 1700 shown by FIGS. 17-19 includes a first opening 1714, a second opening 1716, and a third opening 1718 coupled to corresponding branching vacuum channels 1715 (as shown by FIGS. 17-18B). Each branching vacuum channel is individually coupled to a main vacuum channel 1713 having an outlet opening 1765 positioned at outer surface 1767 of the first section 1700.

During conditions in which the tapered seal 1731 is coupled to inlet 1906 of liquid helium storage reservoir 1900 shown by FIG. 19, the outlet opening 1765 of the main vacuum channel 1713 is coupled to a vacuum passage 1902 of the reservoir 1900 in order to flow substances (e.g., air, particulates, etc.) out of the interior chamber 1712 of the tapered seal 1731. For example, after coupling the tapered seal 1731 to the inlet 1906, a vacuum pump (not shown) coupled to the vacuum passage 1902 of the reservoir 1900 may flow air out of the vacuum passage 1902 in order to reduce the pressure within the vacuum passage 1902. Because the vacuum passage 1902 is coupled with the interior chamber 1712 of the tapered seal 1731 via the main vacuum channel 1713 and branching vacuum channels 1715, and because the o-rings 1711 may press against surfaces of the inlet 1906 in order to seal the inlet 1906, the reduced pressure within the vacuum passage 1902 results in a flow of fluid and/or particles from the interior chamber 1712 to the vacuum passage 1902. The vacuum passage 1902 is fluidly isolated from other areas of the reservoir 1900 (e.g., a helium bath, similar to helium bath 22 shown by FIG. 1 and described above) such that substances flowing from the interior camber 1712 to the vacuum passage 1902 do not mix and/or converge with substances in the other areas of the reservoir 1900.

A technical effect of the disclosure is to enable the tapered seal to be coupled around the fluid passage without inserting a tip (e.g., an end) of the fluid passage through the through-hole of the tapered seal. By forming the tapered seal from two or more sections and coupling the tapered seal to the fluid passage in this way, a likelihood of contamination (e.g., de-sterilization) of the fluid passage and the tapered seal may be reduced. Another technical effect of the disclosure is to maintain the interior of the liquid helium storage reservoir at a lower pressure than atmospheric air pressure by coupling the tapered seal to the inlet opening. Fluids (e.g., a mixture of contrast agents and dissolution medium) may flow within the inner tube through the central opening of the tapered seal, with the tapered seal reducing a flow of air into the liquid helium storage reservoir. Additionally, the tapered seal may be removed from the fluid passage for cleaning, replacement, etc. without coming into contact with the fluid within the fluid passage and/or removing the vial coupled to the end of the fluid passage, thereby enabling the tapered seal to be a re-usable component of the sealing system and reducing an operating cost of the sealing system. Another technical effect of the disclosure is to enable particles and/or fluids to be removed from the interior chamber of the tapered seal via the vacuum channels coupled to the vacuum source. By flowing particles and/or fluids out of the interior chamber through the vacuum channels, a sealing quality (e.g., force of sealing) of the tapered seal against the fluid passage is increased, and a likelihood of contamination of components of the DNP system by the particles and/or fluids is reduced.

In one embodiment, a system comprises: a reservoir including an inlet opening; an outer tube; and a tapered seal shaped to seal against the inlet opening and the outer tube, the tapered seal including: a first section removably couple-able to a second section; a through-hole formed by a first plurality of inner surfaces of both the first section and the second section, the through-hole shaped to encircle the outer tube; and a vacuum channel extending through, from an outer surface to an inner surface of the first plurality of inner surfaces, one of the first section and second section. In a first example of the system, the system further comprises a vacuum source adapted to be coupled to the vacuum channel at the outer surface of the one of the first section and second section. A second example of the system optionally includes the first example, and further includes wherein each surface of the first plurality of inner surfaces of both of the first section and second section is positioned at an angle relative to each adjacent surface of the first plurality of inner surfaces along a length of the through-hole. A third example of the system optionally includes one or both of the first and second examples, and further includes wherein each surface of the first plurality of inner surfaces is joined with each adjacent surface of the first plurality of inner surfaces to form a plurality of teeth, and wherein the plurality of teeth of the first section is shaped to mate with a complementary plurality of teeth of the second section. A fourth example of the system optionally includes one or more or each of the first through third examples, and further includes wherein the vacuum channel includes one main outer channel with an inlet at the outer surface and a plurality of branched vacuum channels branching from the main outer channel, within an interior of the one of the first section and second section, where the plurality of branched vacuum channels extend to individual outlets spaced apart from one another along the inner surface. A fifth example of the system optionally includes one or more or each of the first through fourth examples, and further includes wherein each of the first section and the second section includes an outer surface including one or more detents and wherein the first section is removably coupled to the second section via one or more o-rings positioned within the one or more detents in the outer surface of each of the first section and second section. A sixth example of the system optionally includes one or more or each of the first through fifth examples, and further includes wherein each outer surface includes two detents spaced apart from one another and wherein the vacuum channel is positioned in the outer surface of the one of the first section and second section, between the two detents of the outer surface. A seventh example of the system optionally includes one or more or each of the first through sixth examples, and further includes wherein the reservoir is a liquid helium storage reservoir. An eighth example of the system optionally includes one or more or each of the first through seventh examples, and further includes wherein the first section and the second section each include a plurality of complementary interlocking elements shaped to retain the first section and the second section in interlocking engagement with each other. A ninth example of the system optionally includes one or more or each of the first through eighth examples, and further includes wherein the plurality of interlocking elements of the first section and the second section are formed by a second plurality of inner surfaces positioned adjacent to the first plurality of inner surfaces forming the through-hole and adjacent to outer surfaces of the first section and second section. A tenth example of the system optionally includes one or more or each of the first through ninth examples, and further includes wherein the plurality of interlocking elements includes a first plurality of grooves and a first plurality of protrusions formed by the second plurality of inner surfaces of the first section, and wherein the plurality of interlocking elements includes a second plurality of grooves and a second plurality of protrusions formed by the second plurality of inner surfaces of the second section, with the first plurality of protrusions shaped to engage the second plurality of grooves and the second plurality of protrusions shaped to engage the first plurality of grooves.

In one embodiment, a method comprises: coupling a first section of a tapered seal and a second section of the tapered seal to one another and around an outer perimeter of an outer tube, where first inner surfaces of the first section and second section seal against the outer tube, the first inner surfaces having a toothed structure including a series of alternating peaks and valleys; applying a vacuum to a vacuum channel arranged in one of the first section and second section, the vacuum channel extending from an outer surface to one of the first inner surfaces of the one of the first section and second section, to flow a substance from an interior chamber of the tapered seal, the interior chamber formed by the first inner surfaces, to a location external to the tapered seal; sealing outer surfaces of the tapered seal against an inlet opening of a liquid helium storage reservoir; and flowing fluid within the outer tube while maintaining the tapered seal sealed against the outer tube. In a first example of the method, the method includes wherein coupling the first section of the tapered seal and the second section of the tapered seal to one another includes mating second inner surfaces of the first section with second inner surfaces of the second section, the second inner surfaces of the first section including alternating teeth adapted to mate with complementary alternating teeth of second inner surfaces of the second section. A second example of the method optionally includes the first example, and further includes wherein mating second inner surfaces of the first section with second inner surfaces of the second section includes: mating alternating teeth positioned at a first end of the first section with complementary alternating teeth at a first end of the second section; mating alternating teeth positioned at a second end of the first section with complementary alternating teeth at a second end of the second section; and wherein the first inner surfaces of the first section are annular surfaces positioned between the first and second ends of the first section, and the first inner surfaces of the second section are annular surfaces positioned between the first and second ends of the second section. A third example of the method optionally includes one or both of the first and second examples, and further includes wherein coupling the first section of the tapered seal and the second section of the tapered seal to one another and around the outer perimeter of the outer tube includes sealing the inner surfaces of the first section and second section against the outer tube without inserting the tube through a through-hole formed by the inner surfaces of the first section and second section. A fourth example of the method optionally includes one or more or each of the first through third examples, and further includes flowing fluid within an inner tube positioned within the outer tube while maintaining the tapered seal sealed against the outer tube. A fifth example of the method optionally includes one or more or each of the first through fourth examples, and further includes positioning contrast agents within a sample vial, welding a first end of the outer tube to the sample vial, and positioning the sample vial within the liquid helium storage reservoir.

In another embodiment, a system comprises: a liquid helium storage reservoir including an inlet opening; a sample reservoir positioned within the liquid helium storage reservoir, the sample reservoir coupled to a first fluid passage and fluidly isolated from the liquid helium storage reservoir by the first fluid passage; a vacuum source; and a tapered seal positioned within and sealed against the inlet opening, the tapered seal including: a plurality of sections, with each section of the plurality of sections removably coupled to each adjacent section of the plurality of sections; and a first channel formed by toothed inner surfaces of each of the plurality of sections and extending through the tapered seal, the toothed inner surfaces shaped to seal, via multiple points of contact, against the first fluid passage while the first fluid passage slides within the channel; and a second channel extending through, from an outer surface to an inner surface of the toothed inner surfaces, one section of the plurality of sections, the second channel coupled to the vacuum source at the outer surface. In a first example of the system, the system further comprises a detent formed by the outer surface and extending along an outer perimeter of the tapered seal in a direction around an axis of the first channel, the detent adapted to couple with an o-ring positioned to surround the outer perimeter. A second example of the system optionally includes the first example, and further includes a plurality of branching channels coupled to the second channel within an interior of the tapered seal and extending from the second channel to the toothed inner surfaces, each branching channel of the plurality of branching channels forming an individual opening at the toothed inner surfaces.

In another representation, a dynamic nuclear polarization system comprises: a liquid helium storage reservoir including an inlet opening; an outer tube; an inner tube positioned within the outer tube; and a tapered seal shaped to seal against the inlet opening and the outer tube, the tapered seal including: a first section removably coupleable to a second section; a through-hole formed by a first plurality of inner surfaces of both the first section and the second section, the through-hole shaped to encircle the outer tube with the inner surfaces sealed against the outer tube; and a vacuum channel extending through one of the first section or second section, the vacuum channel coupled to a vacuum source.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:
1. A system, comprising:
a reservoir including an inlet opening;
an outer tube; and
a tapered seal shaped to seal against the inlet opening and the outer tube, the tapered seal including:
 a first section removably coupleable to a second section;
 a through-hole formed by a first plurality of inner surfaces of both the first section and the second section, the through-hole shaped to encircle the outer tube; and
 a vacuum channel extending through, from an outer surface to an inner surface of the first plurality of inner surfaces, one of the first section and the second section.

2. The system of claim 1, further comprising a vacuum source adapted to be coupled to the vacuum channel at the outer surface of the one of the first section and the second section.

3. The system of claim 1, wherein each surface of the first plurality of inner surfaces of both of the first section and the second section is positioned at an angle relative to each adjacent surface of the first plurality of inner surfaces along a length of the through-hole.

4. The system of claim 3, wherein each surface of the first plurality of inner surfaces is joined with each adjacent surface of the first plurality of inner surfaces to form a plurality of teeth, and wherein the plurality of teeth of the first section is shaped to mate with a complementary plurality of teeth of the second section.

5. The system of claim 1, wherein the vacuum channel includes one main outer channel with an inlet at the outer surface and a plurality of branched vacuum channels branching from the main outer channel, within an interior of the one of the first section and the second section, where the plurality of branched vacuum channels extends to individual outlets spaced apart from one another along the inner surface.

6. The system of claim 1, wherein each of the first section and the second section includes an outer surface including one or more detents and wherein the first section is removably coupled to the second section via one or more o-rings positioned within the one or more detents in the outer surface of each of the first section and the second section.

7. The system of claim 6, wherein each outer surface includes two detents spaced apart from one another and wherein the vacuum channel is positioned in the outer surface of the one of the first section and the second section, between the two detents of the outer surface.

8. The system of claim 1, wherein the reservoir is a liquid helium storage reservoir.

9. The system of claim 1, wherein the first section and the second section each include a plurality of complementary interlocking elements shaped to retain the first section and the second section in interlocking engagement with each other.

10. The system of claim 9, wherein the pluralities of interlocking elements of the first section and the second section are formed by a second plurality of inner surfaces positioned adjacent to the first plurality of inner surfaces forming the through-hole and adjacent to outer surfaces of the first section and the second section.

11. The system of claim 10, wherein the pluralities of interlocking elements include a first plurality of grooves and a first plurality of protrusions formed by the second plurality of inner surfaces of the first section, and wherein the pluralities of interlocking elements include a second plurality of grooves and a second plurality of protrusions formed by the second plurality of inner surfaces of the second section, with the first plurality of protrusions shaped to engage the second plurality of grooves and the second plurality of protrusions shaped to engage the first plurality of grooves.

12. A method, comprising:
coupling a first section of a tapered seal and a second section of the tapered seal to one another and around an outer perimeter of an outer tube, where first inner surfaces of the first section and the second section seal against the outer tube, the first inner surfaces having a toothed structure including a series of alternating peaks and valleys;
applying a vacuum to a vacuum channel arranged in one of the first section and the second section, the vacuum channel extending from an outer surface to one of the first inner surfaces of the one of the first section and the second section, to flow a substance from an interior chamber of the tapered seal, the interior chamber formed by the first inner surfaces, to a location external to the tapered seal;
sealing outer surfaces of the tapered seal against an inlet opening of a liquid helium storage reservoir; and
flowing fluid within the outer tube while maintaining the tapered seal sealed against the outer tube.

13. The method of claim 12, wherein coupling the first section of the tapered seal and the second section of the tapered seal to one another includes mating second inner surfaces of the first section with second inner surfaces of the second section, the second inner surfaces of the first section including alternating teeth adapted to mate with complementary alternating teeth of the second inner surfaces of the second section.

14. The method of claim 13, wherein mating the second inner surfaces of the first section with the second inner surfaces of the second section includes:
mating alternating teeth positioned at a first end of the first section with complementary alternating teeth at a first end of the second section;
mating alternating teeth positioned at a second end of the first section with complementary alternating teeth at a second end of the second section; and
wherein the first inner surfaces of the first section are annular surfaces positioned between the first and second ends of the first section, and the first inner surfaces of the second section are annular surfaces positioned between the first and second ends of the second section.

15. The method of claim 12, wherein coupling the first section of the tapered seal and the second section of the tapered seal to one another and around the outer perimeter of the outer tube includes sealing the inner surfaces of the first section and the second section against the outer tube without inserting the tube through a through-hole formed by the inner surfaces of the first section and the second section.

16. The method of claim 12, further comprising flowing fluid within an inner tube positioned within the outer tube while maintaining the tapered seal sealed against the outer tube.

17. The method of claim 12, further comprising positioning contrast agents within a sample vial, welding a first end of the outer tube to the sample vial, and positioning the sample vial within the liquid helium storage reservoir.

18. A system, comprising:
a liquid helium storage reservoir including an inlet opening;
a sample reservoir positioned within the liquid helium storage reservoir, the sample reservoir coupled to a first fluid passage and fluidly isolated from the liquid helium storage reservoir by the first fluid passage;
a vacuum source; and
a tapered seal positioned within and sealed against the inlet opening, the tapered seal including:
a plurality of sections, with each section of the plurality of sections removably coupled to each adjacent section of the plurality of sections; and
a first channel formed by toothed inner surfaces of each of the plurality of sections and extending through the tapered seal, the toothed inner surfaces shaped to seal, via multiple points of contact, against the first fluid passage while the first fluid passage slides within the channel; and
a second channel extending through, from an outer surface to an inner surface of the toothed inner surfaces, one section of the plurality of sections, the second channel coupled to the vacuum source at the outer surface.

19. The system of claim 18, further comprising a detent formed by the outer surface and extending along an outer perimeter of the tapered seal in a direction around an axis of the first channel, the detent adapted to couple with an o-ring positioned to surround the outer perimeter.

20. The system of claim 18, further comprising a plurality of branching channels coupled to the second channel within an interior of the tapered seal and extending from the second channel to the toothed inner surfaces, each branching channel of the plurality of branching channels forming an individual opening at the toothed inner surfaces.

* * * * *